United States Patent
Koch et al.

(10) Patent No.: US 8,695,289 B2
(45) Date of Patent: Apr. 15, 2014

(54) PHOTOVOLTAIC ROOFING ELEMENTS, PHOTOVOLTAIC ROOFING SYSTEMS, METHODS AND KITS

(75) Inventors: Steven A. Koch, Collegeville, PA (US); Husnu M. Kalkanoglu, Swarthmore, PA (US); Gregory F. Jacobs, Oreland, PA (US); Wayne E. Shaw, Glen Mills, PA (US); Robert L. Jenkins, HoneyBrook, PA (US); Robert D. Livsey, Limerick, PA (US)

(73) Assignee: Certainteed Corporation, Valley Forge, PA (US)

(*) Notice: Subject to any disclaimer, the term of this patent is extended or adjusted under 35 U.S.C. 154(b) by 193 days.

(21) Appl. No.: 12/634,403

(22) Filed: Dec. 9, 2009

(65) Prior Publication Data

US 2010/0146878 A1 Jun. 17, 2010

Related U.S. Application Data

(60) Provisional application No. 61/121,130, filed on Dec. 9, 2008, provisional application No. 61/238,566, filed on Aug. 31, 2009.

(51) Int. Cl.
*E04D 13/18* (2006.01)
(52) U.S. Cl.
USPC ............ 52/173.3; 52/518; 136/251; 428/189
(58) Field of Classification Search
USPC ................. 52/173.3, 518; 136/251, 244, 243; 428/77, 189
See application file for complete search history.

(56) References Cited

U.S. PATENT DOCUMENTS

| | | | | |
|---|---|---|---|---|
| 4,321,416 A | * | 3/1982 | Tennant | 136/244 |
| 5,437,735 A | * | 8/1995 | Younan et al. | 136/251 |
| 5,575,861 A | * | 11/1996 | Younan et al. | 136/251 |
| 5,583,057 A | * | 12/1996 | Inoue | 438/64 |
| 5,590,495 A | * | 1/1997 | Bressler et al. | 52/173.3 |
| 5,990,414 A | * | 11/1999 | Posnansky | 136/244 |
| 6,360,497 B1 | * | 3/2002 | Nakazima et al. | 52/173.3 |
| 6,453,629 B1 | * | 9/2002 | Nakazima et al. | 52/173.3 |
| 6,506,970 B2 | * | 1/2003 | Yamawaki | 136/251 |
| 6,521,821 B2 | | 2/2003 | Makita et al. | |
| 6,856,496 B1 | * | 2/2005 | Mucci et al. | 361/20 |
| 7,297,867 B2 | * | 11/2007 | Nomura et al. | 136/251 |
| 7,678,990 B2 | * | 3/2010 | McCaskill et al. | 136/244 |
| 2002/0038530 A1 | * | 4/2002 | Clark | 52/171.3 |
| 2002/0129849 A1 | * | 9/2002 | Heckeroth | 136/251 |
| 2002/0134422 A1 | * | 9/2002 | Bauman et al. | 136/244 |

(Continued)

FOREIGN PATENT DOCUMENTS

DE 4216171 A1 * 1/1993 ............ E04D 13/18
GB 2448920 A 11/2008
WO 2008073905 A2 6/2008

*Primary Examiner* — Robert Canfield
*Assistant Examiner* — Babajide Demuren
(74) *Attorney, Agent, or Firm* — McDonnell Boehnen Hulbert & Berghoff LLP

(57) ABSTRACT

The present invention relates generally to the photovoltaic generation of electrical energy. The present invention relates more particularly to photovoltaic roofing products for use in photovoltaically generating electrical energy. One aspect of the invention is a photovoltaic roofing element comprising: a flexible roofing substrate; a photovoltaic element disposed on the flexible roofing substrate; and an electrical connector operatively coupled to the photovoltaic element, wherein the flexible roofing substrate has formed therein a recess shaped to at least partially receive the electrical connector.

15 Claims, 16 Drawing Sheets

(56) References Cited

U.S. PATENT DOCUMENTS

| | | | |
|---|---|---|---|
| 2003/0154666 A1* | 8/2003 | Dinwoodie | 52/173.3 |
| 2004/0118446 A1* | 6/2004 | Toyomura | 136/244 |
| 2004/0261836 A1* | 12/2004 | Kataoka et al. | 136/244 |
| 2005/0076948 A1* | 4/2005 | Komamine | 136/251 |
| 2005/0178429 A1* | 8/2005 | McCaskill et al. | 136/251 |
| 2005/0257823 A1* | 11/2005 | Zwanenburg | 136/244 |
| 2005/0263178 A1* | 12/2005 | Montello et al. | 136/244 |
| 2005/0279400 A1* | 12/2005 | Banister | 136/244 |
| 2006/0032527 A1* | 2/2006 | Stevens et al. | 136/251 |
| 2007/0074755 A1 | 4/2007 | Eberspacher et al. | |
| 2007/0227583 A1* | 10/2007 | Davies et al. | 136/251 |
| 2008/0000512 A1* | 1/2008 | Flaherty et al. | 136/244 |
| 2008/0105291 A1* | 5/2008 | Pisklak et al. | 136/244 |
| 2008/0149163 A1* | 6/2008 | Gangemi | 136/246 |
| 2008/0155908 A1* | 7/2008 | Nomura et al. | 52/173.3 |
| 2008/0289272 A1* | 11/2008 | Flaherty et al. | 52/173.3 |
| 2008/0302030 A1* | 12/2008 | Stancel et al. | 52/173.3 |
| 2009/0215304 A1 | 8/2009 | Faust et al. | |
| 2010/0170169 A1* | 7/2010 | Railkar et al. | 52/173.3 |

* cited by examiner

PHOTOVOLTAIC ROOFING ELEMENTS, PHOTOVOLTAIC ROOFING SYSTEMS, METHODS AND KITS

CROSS-REFERENCE TO RELATED APPLICATIONS

This application claims priority under 35 U.S.C. §119(e) to U.S. Provisional Patent Application Ser. No. 61/121,130, filed Dec. 9, 2008, and U.S. Provisional Patent Application Ser. No. 61/238,566, filed Aug. 31, 2009, each of which is hereby incorporated herein by reference in its entirety.

BACKGROUND OF THE INVENTION

1. Field of the Invention

The present invention relates generally to the photovoltaic generation of electrical energy. The present invention relates more particularly to photovoltaic roofing products for use in photovoltaically generating electrical energy.

2. Technical Background

The search for alternative sources of energy has been motivated by at least two factors. First, fossil fuels have become increasingly expensive due to increasing scarcity and unrest in areas rich in petroleum deposits. Second, there exists overwhelming concern about the effects of the combustion of fossil fuels on the environment due to factors such as air pollution (from $NO_x$, hydrocarbons and ozone) and global warming (from $CO_2$). In recent years, research and development attention has focused on harvesting energy from natural environmental sources such as wind, flowing water, and the sun. Of the three, the sun appears to be the most widely useful energy source across the continental United States; most locales get enough sunshine to make solar energy feasible.

Accordingly, there are now available components that convert light energy into electrical energy. Such "photovoltaic cells" are often made from semiconductor-type materials such as doped silicon in either single crystalline, polycrystalline, or amorphous form. The use of photovoltaic cells on roofs is becoming increasingly common, especially as system performance has improved. They can be used to provide at least a significant fraction of the electrical energy needed for a building's overall function; or they can be used to power one or more particular devices, such as exterior lighting systems and well pumps.

Accordingly, research and development attention has turned toward integrating photovoltaic cells with roofing products such as shingles, shakes or tiles. A plurality of photovoltaic roofing elements (i.e., including photovoltaic media integrated with a roofing product) can be installed together on a roof, and electrically interconnected to form a photovoltaic roofing system that provides both environmental protection and photovoltaic power generation.

Roofing products equipped with photovoltaic media often require electrical connectors to be attached to the products to allow electricity to be collected from photovoltaic cells and delivered to an electrical system. Such connectors can be, for example, mated connectors for connecting adjacent photovoltaic roofing elements, cables for connecting photovoltaic elements to the mated connectors, and/or junction boxes for interconnections within a single photovoltaic roofing element. Such devices must be robust to maintain the electrical connection in use and over time. In some cases, bulky connectors with safety locks may be required depending on the accessibility of the electrical connection. If the electrical connector will be covered by the roofing product in use, requirements can be less extreme, but a robust connection remains necessary. There exist low-profile connectors, but even these can be difficult to integrate with thin roofing products like asphalt or bituminous roofing shingles.

There remains a need for photovoltaic roofing products that address these deficiencies.

SUMMARY OF THE INVENTION

One aspect of the invention is a photovoltaic roofing element comprising:
  a flexible roofing substrate;
  a photovoltaic element disposed on the flexible roofing substrate; and
  an electrical connector operatively coupled to the photovoltaic element,
wherein the flexible roofing substrate has formed therein a recess shaped to at least partially receive the electrical connector.

Another aspect of the invention is a photovoltaic roofing element comprising:
  a flexible roofing substrate, the flexible roofing substrate comprising
    a base of flexible roofing material having a top surface, the top surface having a headlap zone and an exposure zone, and
    one or more layers of shim material disposed on the top surface of the base in the headlap zone;
  a photovoltaic element disposed on the top surface of the base; and
  an electrical connector operatively connected to the photovoltaic element and disposed on the top surface of the base,
  wherein the one or more layers of shim material have a total thickness at least about as great as the thickness of the electrical connector.

Another aspect of the invention is a photovoltaic roofing element comprising:
  a flexible roofing substrate, the flexible roofing substrate comprising
    a base of flexible roofing material having a top surface and a bottom surface, the top surface having a headlap zone and an exposure zone; and
    one or more layers of shim material disposed on the bottom surface of the flexible roofing substrate;
  a photovoltaic element disposed on the top surface of the base; and
  an electrical connector operatively connected to the photovoltaic element and disposed on the top surface of the base,
  wherein the one or more layers of flexible roofing material have a total thickness at least about as great as the thickness of the electrical connector.

Another aspect of the invention is a photovoltaic roofing system including a plurality of photovoltaic roofing elements as described above, electrically interconnected. The photovoltaic roofing system can be, for example, disposed on a roof.

Another aspect of the invention is a photovoltaic roofing system comprising:
  a first photovoltaic roofing element, the first photovoltaic roofing element comprising
    a flexible roofing substrate,
    a photovoltaic element disposed on the flexible roofing substrate, and
    an electrical connector operatively coupled to the photovoltaic element; and a second photovoltaic roofing element disposed so as to cover the electrical connector of the first photovoltaic roofing element, the second photovoltaic roofing element comprising:
  a flexible roofing substrate having a recess formed in its bottom surface, the electrical connector of the first photovoltaic roofing element being at least partially disposed in the recess,
  a photovoltaic element disposed on the flexible roofing substrate, and
  an electrical connector operatively coupled to the photovoltaic element.

Another aspect of the invention is a photovoltaic roofing system comprising:
  a first photovoltaic roofing element, the first photovoltaic roofing element comprising
    a flexible roofing substrate,
    a photovoltaic element disposed on the flexible roofing substrate, and
    an electrical connector operatively coupled to the photovoltaic element; and
  a second photovoltaic roofing element disposed adjacent the first photovoltaic roofing element, the second photovoltaic roofing element comprising:
    a flexible roofing substrate having a recess formed therein, the electrical connector of the first photovoltaic roofing element being at least partially disposed in the recess,
    a photovoltaic element disposed on the flexible roofing substrate, and
    an electrical connector operatively coupled to the photovoltaic element.

Another aspect of the invention is a kit for the assembly of a photovoltaic roofing system, the kit including a plurality of photovoltaic roofing elements as described above.

The photovoltaic roofing elements, systems and kits of the present invention can result in a number of advantages. The inventors have determined that even when the roofing substrate is relatively thin and flexible (e.g., an asphalt or bituminous roofing shingle), even a low profile or flatter style of connector can be thicker than the roofing substrate. In such cases, the connector can telegraph its structure to the top surface of the roofing substrate, resulting in an undesirably wavy or distorted appearance. Local telegraphing of bumps over these electrical connectors can also lead to stress points and wear points on or in the roofing substrate, causing a deleterious effect on product performance. In some aspects, this invention solves the problem of electrical connectors telegraphing shapes through to the top surface of thin flexible roofing products equipped with photovoltaic media. This can help improve the aesthetic look and reduce stress/wear points of a roof equipped with the photovoltaic roofing elements and photovoltaic roofing systems of the present invention. Other advantages will be apparent to the person of skill in the art.

BRIEF DESCRIPTION OF THE DRAWINGS

The accompanying drawings are not necessarily to scale, and sizes of various elements can be distorted for clarity.

DETAILED DESCRIPTION OF THE INVENTION

Figure 1:
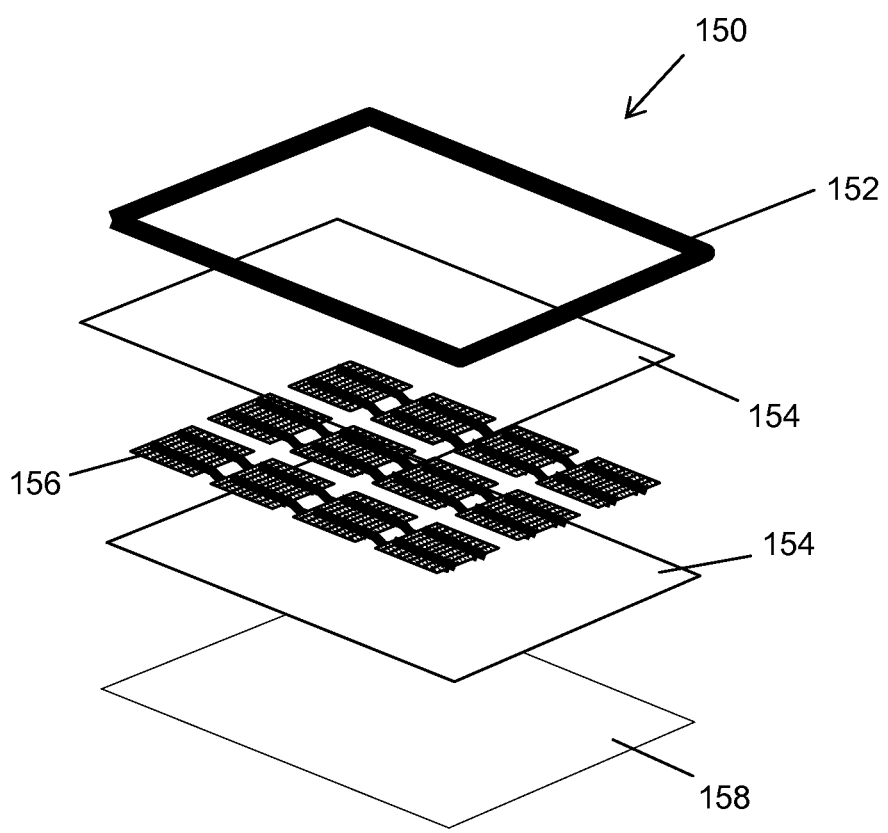
FIG. 1 is a schematic exploded perspective view of a photovoltaic element suitable for use in various aspects of the present invention.

One aspect of the invention is a photovoltaic roofing element comprising a flexible roofing substrate; a photovoltaic element disposed on the flexible roofing substrate; and an electrical connector operatively coupled to the photovoltaic element, wherein the roofing substrate has formed therein a recess shaped to at least partially receive the electrical connector. The recess can be formed, for example, in a top or a bottom surface of the photovoltaic roofing element, or along a side of the photovoltaic roofing element (e.g., as a "notch" or a "cutout").

The electrical connector can be disposed in the recess. For example, the electrical connector can in certain embodiments be affixedly disposed in the recess. For example, the electrical connector can be a junction box affixedly disposed in the recess. In other embodiments, the electrical connector can be generally movable with respect to the recess, and disposed in the recess when the photovoltaic roofing element is installed. For example, the electrical connector can be a cable and/or a mating electrical connector that is movable in order to be connected to an adjacent photovoltaic roofing element or to an electrical bus for collection of electrical power, then disposed in the recess once connected. In certain embodiments of the invention, the electrical connector has a thickness dimension that is greater than the thickness of the photovoltaic element, and the flexible roofing substrate has a recess formed therein of appropriate size and shape to receive the volume of the electrical connector when the photovoltaic roofing element is installed on a roof. In some cases, the recess is formed in the flexible roofing substrate of a given photovoltaic roofing element, and disposed so as to contain at least part of the volume of the electrical connector of the same photovoltaic roofing element. In other embodiments, the recess is disposed so as to contain at least part of the volume of an electrical connector of a different photovoltaic roofing element, for example an underlying photovoltaic roofing element, or an overlying photovoltaic roofing element.

In certain embodiments of the invention, the recess can be disposed to retain an electrical connector inlayed in the material so that a bump or surface irregularity that may otherwise telegraph through to a shingle of an overlying course is avoided. In some embodiments, the recess is further provided with a sealing layer for containment and waterproofing of the connector element. In other embodiments, the recess is formed as a cutout or notch in some, but not all, layers of a multilayer laminate roofing substrate (e.g., an asphalt shingle). In some embodiments, a continuous notch running the length of the shingle is provided that can contain one or more connectors (e.g., cables and mating connectors). In some cases, additional shingle shim material may be employed in the vicinity of the electrical connector to offset a thickness differential in the roofing product near the electrical connector.

Photovoltaic elements suitable for use in the various aspects of the present invention include one or more interconnected photovoltaic cells provided together, for example, in a single package. The photovoltaic cells of the photovoltaic elements can be based on any desirable photovoltaic material system, such as monocrystalline silicon; polycrystalline silicon; amorphous silicon; III-V materials such as indium gallium nitride; II-VI materials such as cadmium telluride; and more complex chalcogenides (group VI) and pnicogenides (group V) such as copper indium diselenide and copper indium gallium selenide. For example, one type of suitable photovoltaic cell includes an n-type silicon layer (doped with an electron donor such as phosphorus) oriented toward incident solar radiation on top of a p-type silicon layer (doped with an electron acceptor, such as boron), sandwiched between a pair of electrically-conductive electrode layers. Another type of suitable photovoltaic cell is an indium phosphide-based thermo-photovoltaic cell, which has high energy conversion efficiency in the near-infrared region of the solar spectrum. Thin film photovoltaic materials and flexible photovoltaic materials can be used in the construction of photovoltaic elements for use in the present invention. In one embodiment of the invention, the photovoltaic element includes a monocrystalline silicon photovoltaic cell or a polycrystalline silicon photovoltaic cell. The photovoltaic elements for use in the present invention can be flexible, or alternatively can be rigid.

The photovoltaic elements can be encapsulated photovoltaic elements, in which photovoltaic cells are encapsulated between various layers of material (e.g., as a laminate). For example, a photovoltaic laminate can include a top laminate layer at its top surface, and a bottom laminate layer at its bottom surface. The top laminate layer material can, for example, provide environmental protection to the underlying photovoltaic cells, and any other underlying layers. Examples of suitable materials for the top layer material include fluoropolymers, for example ETFE ("TEFZEL", or NORTON ETFE), PFE, FEP, PVF ("TEDLAR"), PCTFE or PVDF. The top laminate layer material can alternatively be, for example, a glass sheet, or a non-fluorinated polymeric material (e.g., polypropylene). The bottom laminate layer material can be, for example, a fluoropolymer, for example ETFE ("TEFZEL", or NORTON ETFE), PFE, FEP, PVDF or PVF ("TEDLAR"). The bottom laminate layer material can alternatively be, for example, a polymeric material (e.g., polyolefin such as polypropylene, polyester such as PET); or a metallic material (e.g., steel or aluminum sheet).

As the person of skill in the art will appreciate, a photovoltaic laminate can include other layers interspersed between the top laminate layer and the bottom laminate layer. For example, a photovoltaic laminate can include structural elements (e.g., a reinforcing layer of glass, metal, glass or polymer fibers, a rigid film, or a flexible film); adhesive layers (e.g., EVA to adhere other layers together); mounting structures (e.g., clips, holes, or tabs); one or more electrical components (e.g., electrodes, electrical connectors; optionally connectorized electrical wires or cables) for electrically interconnecting the photovoltaic cell(s) of the encapsulated photovoltaic element with an electrical system. As described in more detail below, the return electrical path, any series interconnections between photovoltaic elements, and any bypass diodes can be included within the laminate. An example of a photovoltaic laminate suitable for use in the present invention is shown in schematic exploded view FIG. 1. Encapsulated photovoltaic element 150 includes a top protective layer 152 (e.g., glass or a fluoropolymer film such as ETFE, PVDF, PVF, FEP, PFA or PCTFE); encapsulant layers 154 (e.g., EVA, functionalized EVA, crosslinked EVA, silicone, thermoplastic polyurethane, maleic acid-modified polyolefin, ionomer, or ethylene/(meth)acrylic acid copolymer); a layer of electrically-interconnected photovoltaic cells 156 (which can include the return electrical path and bypass diode as described above); and a backing layer 158 (e.g., PVDF, PVF, PET).

The photovoltaic element can include at least one antireflection coating, for example as the top layer material in an encapsulated photovoltaic element, or disposed between the top layer material and the photovoltaic cells. The photovoltaic element can also be made colored, textured, or patterned, for example by using colored, textured or patterned layers in the construction of the photovoltaic element. Methods for adjusting the appearance of photovoltaic elements are described, for example, in U.S. Provisional Patent Application Ser. No. 61/019,740, and U.S. patent application Ser. Nos. 11/456, 200, 11/742,909, 12/145,166, 12/266,481 and 12/267,458 each of which is hereby incorporated herein by reference.

Suitable photovoltaic elements can be obtained, for example, from China Electric Equipment Group of Nanjing, China, as well as from several domestic suppliers such as Uni-Solar Ovonic, Sharp, Shell Solar, BP Solar, USFC, First-Solar, Ascent Solar, General Electric, Schott Solar, Evergreen Solar and Global Solar. Moreover, the person of skill in the art can fabricate photovoltaic laminates using techniques such as lamination or autoclave processes. Photovoltaic laminates can be made, for example, using methods disclosed in U.S. Pat. No. 5,273,608, which is hereby incorporated herein by reference. Flexible photovoltaic elements are commercially available from Uni-Solar as L-cells having a dimension of approximately 9.5"×14", S-cells having dimensions of approximately 4.75"×14", and T-cells having dimensions of approximately 4.75"×7". Photovoltaic laminates of custom sizes can also be made.

The photovoltaic element also has an operating wavelength range. Solar radiation includes light of wavelengths spanning the near UV, the visible, and the near infrared spectra. As used herein, the term "solar radiation," when used without further elaboration means radiation in the wavelength range of 300 nm to 2500 nm, inclusive. Different photovoltaic elements have different power generation efficiencies with respect to different parts of the solar spectrum. Amorphous doped silicon is most efficient at visible wavelengths, and polycrystalline doped silicon and monocrystalline doped silicon are most efficient at near-infrared wavelengths. As used herein, the operating wavelength range of a photovoltaic element is the wavelength range over which the relative spectral response is at least 10% of the maximal spectral response. According to certain embodiments of the invention, the operating wavelength range of the photovoltaic element falls within the range of about 300 nm to about 2000 nm. In certain embodiments of the invention, the operating wavelength range of the photovoltaic element falls within the range of about 300 nm to about 1200 nm.

The person of skill in the art will select bypass diode characteristics depending on a number of factors. The characteristics of the diode will depend, for example, on the type and size of photovoltaic element used, the intensity and variability of sunlight expected at the installation location, and the resistance at which a shaded photovoltaic element causes unacceptable system inefficiency. For example, the bypass diode can be configured to bypass a photovoltaic element when its output drops below about 30% of its maximum (i.e., in full sunlight at noon on the solstice) output (i.e., a about 30% or greater degradation in photovoltaically-generated current), below about 50% of its maximum output, below about 70% of its maximum output, below about 90% of its maximum output, or even below about 95% of its maximum output. For example, in one embodiment, in a 20 cell series-connected array of 1 volt/5 amp producing photovoltaic elements, the bypass diodes can be selected to bypass the photovoltaic elements when the output current drops below 4.75 amps (i.e., below 95% of the maximum output). Of course, as the person of skill will appreciate, each system design will have its own set of parameters; with higher amperage systems, relatively more degradation of current can be tolerated. In certain embodiments, the bypass diode can be an 8 amp bypass diode, available from Northern Arizona Wind & Sun, Flagstaff, Ariz.

In other embodiments, the bypass diode can be configured to bypass a photovoltaic element when its resistivity increases by at least about 400% of its resistivity at maximum output, at least about 300% of its resistivity at maximum output, at least about 100% of its resistivity at maximum output, at least about 50% of its resistivity at maximum output, at least about 25% of its resistivity at its maximum output, or even at least about 5% of its resistivity at maximum output.

The present invention can be practiced using any of a number of types of flexible roofing substrates. For example, the flexible roofing substrate can be an asphalt shingle, a bituminous shingle or a plastic shingle. For example, the flexible roofing substrate can be a multilayer asphalt shingle. The manufacture of photovoltaic roofing elements using a variety of roofing substrates are described, for example, in U.S. patent application Ser. Nos. 12/146,986, 12/266,409, 12/268,313, 12/351,653, and 12/339,943, and U.S. Patent Application Publication no. 2007/0266562, each of which is hereby incorporated herein by reference in its entirety.

A variety of electrical connectors can be used in practicing the various embodiments of the invention. An electrical connector can take the form of, for example, a mating electrical connector (i.e., adapted to mate with another mating electrical connector to make an electrical connection therebetween). Mating connectors can mate with one another, for example, in a male/female fashion. An electrical connector can also take the form of a cable that interconnects a mating connector with the photovoltaic element. An electrical connector can also take a form of a junction box that interconnects various electrical wires and cables associated with the photovoltaic elements, mating connectors or other electrical components such as bypass diodes. Any or all of these types of electrical connectors may be disposed in the recess of a flexible roofing substrate.

Figure 2:
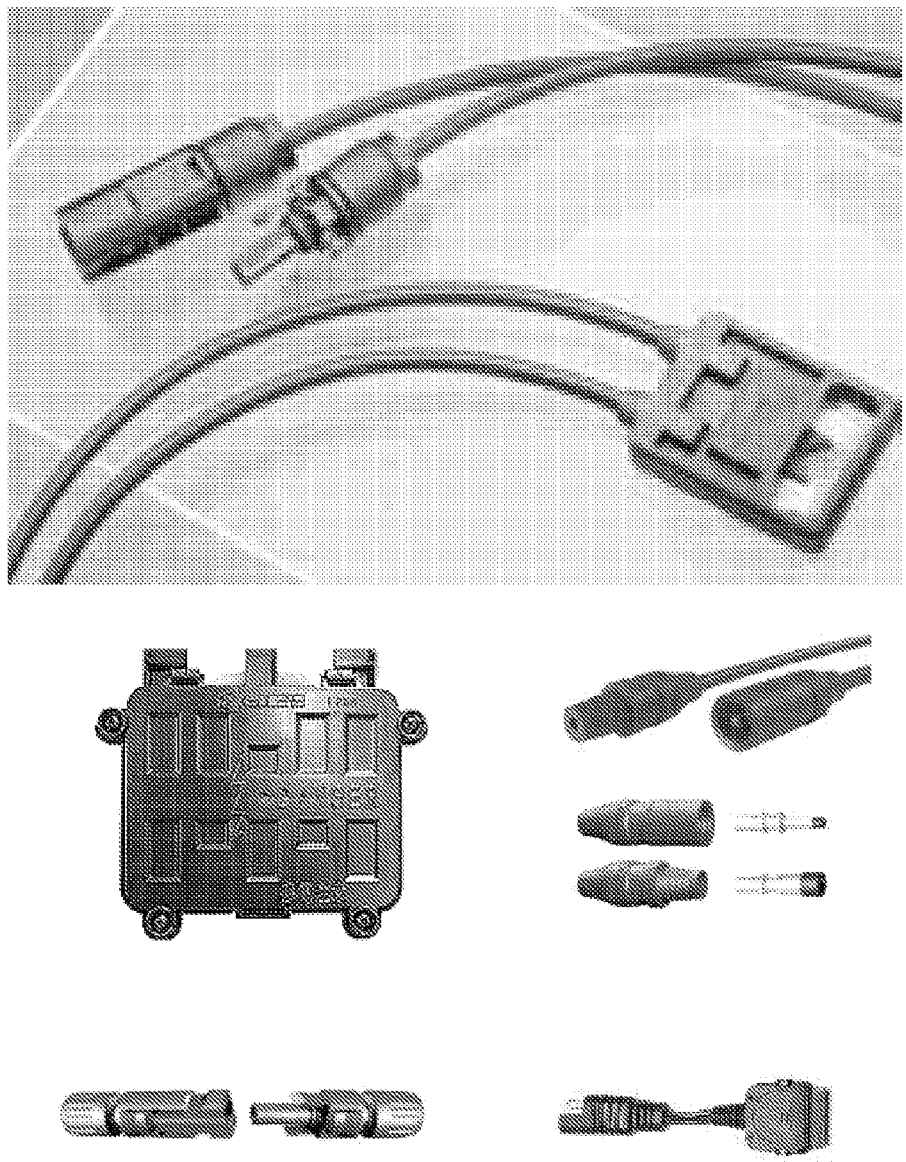
FIG. 2 provides pictures of electrical connectors suitable for use in various aspects of the present invention.

Examples of suitable electrical connectors are shown in FIG. 2. The mating connectors and junction boxes depicted are available from Tyco Electronics, Berwyn, Pa. (trade name Solarlok) and Multi-Contact USA of Santa Rosa, Calif. (trade name Solarline). U.S. Pat. Nos. 7,445,508 and 7,387,537, U.S. patent application Ser. Nos. 11/743,073, 12/266,498, 12/268,313, 12/359,978 and U.S. Provisional Patent Application Ser. No. 61/121,130, each of which is hereby incorporated herein by reference in its entirety, disclose electrical connectors for use with photovoltaic roofing products. All of these electrical connectors are relatively flat and low in profile compared to some other connectors, but they can still be thicker than typical flexible roofing materials such as, for example, asphalt shingles, and would generally have a larger thickness dimension than a photovoltaic laminate structure. Accordingly, their use with typical flexible roofing materials would result in undesirable appearance and stress/wear points, as described above. Accordingly, such electrical connectors can be useful in practicing various aspects of the present invention. Electrical connectors desirably meet UNDERWRITERS LABORATORIES and NATIONAL ELECTRICAL CODE standards.

The invention will be further described with reference to embodiments depicted the appended figures. It will be appreciated that elements in the figures are illustrated for simplicity and clarity and have not necessarily been drawn to scale. For example, the dimensions of some of the elements in the figures may be exaggerated relative to other elements to help to improve understanding of embodiments of the invention.

Figure 3:
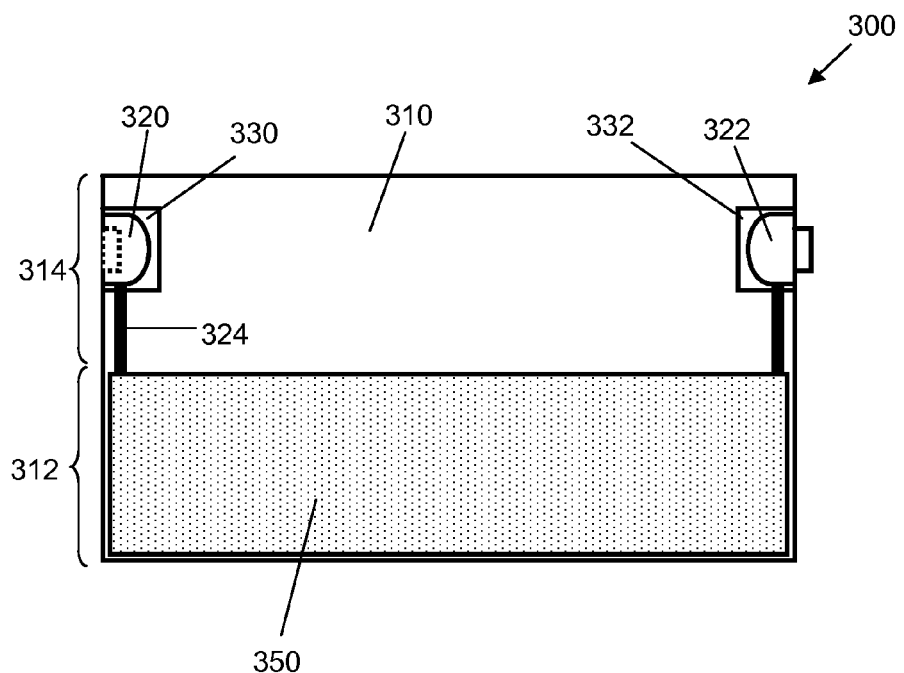
FIG. 3 is a schematic top view and FIG. 4 is a schematic cross-sectional view of a photovoltaic roofing element according to one embodiment of the invention.
Figure 4:
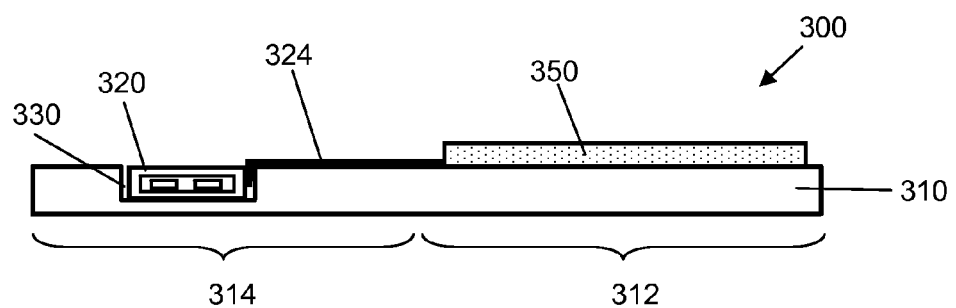

FIG. 3 is a schematic top view and FIG. 4 is a schematic cross-sectional view of a photovoltaic roofing element according to one embodiment of the invention. Photovoltaic roofing element 300 includes a flexible roofing substrate 310 (here, an asphalt shingle) having a exposure zone 312 (i.e., the part of the shingle that will be exposed when installed on a roof) and a headlap zone 314 (the part that will be covered by an overlying course of shingles). A photovoltaic element 350 is disposed on the flexible roofing substrate in the exposure zone. The photovoltaic element further includes two electrical connectors (here, mating electrical connectors) 320 and 322, which are operatively coupled to the photovoltaic element 350, in this embodiment through wires 324. The mating electrical connectors in this embodiment mate in a male/female fashion. The flexible roofing substrate has recesses 330 and 332 formed therein, which are adapted to at least partially receive the mating electrical connectors 320 and 322.

In the embodiment of FIGS. 3 and 4 the electrical connectors are disposed entirely within the recesses. In other embodiments, the electrical connectors can be only partially disposed within the recesses; that is, some portion of an electrical connector can in some circumstances protrude from the recess. The electrical connectors can be affixed into the recesses, or alternatively can be merely held within them.

In cases where no recess is provided for the wires connecting the photovoltaic element to the mating electrical connector, they are desirably relatively flat in cross-sectional shape, so as not to cause a significant bump in an overlying roofing element. In certain other embodiments, the wires are disposed within the flexible roofing substrate itself.

The recess can be formed in a variety of surfaces of the flexible roofing substrate. For example, as shown in FIGS. 3 and 4, the recess can be formed in a top surface of the flexible roofing substrate. As shown in FIG. 4, the recess does not go through the thickness of the entire asphalt shingle.

Figure 5:
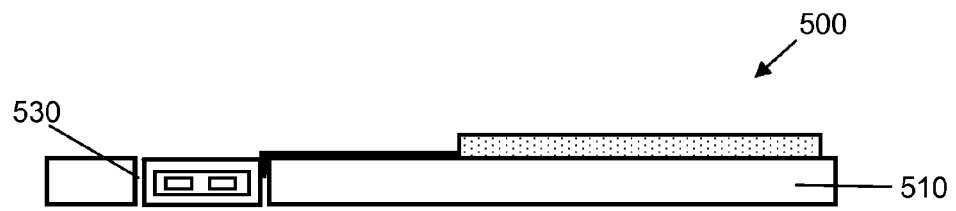
FIG. 5 is a schematic cross-sectional view of a photovoltaic roofing element according to another embodiment of the invention.

Another embodiment is shown in cross-sectional view in FIG. 5. In this photovoltaic roofing element 500, the top view is similar to that shown in FIG. 3, but the recess is formed in the side of the flexible roofing substrate 510, and the recess 530 goes all the way through the flexible roofing substrate. This configuration can be advantaged in that it would prevent pooling of any water that is blown-back up underneath the overlying roofing elements. In other embodiments, a sealing film can be applied to the flexible roofing substrate in the neighborhood of the recess (e.g., on its top surface, on its bottom surface, or both), so as to provide a water-resistant seal.

A recess can be formed through less than all layers of a multilayer asphalt shingle (or other flexible roofing substrate). For example, the recess can be formed as a hole or cutout in at least one, but not all the layers of a multilayer asphalt shingle.

Figure 6:
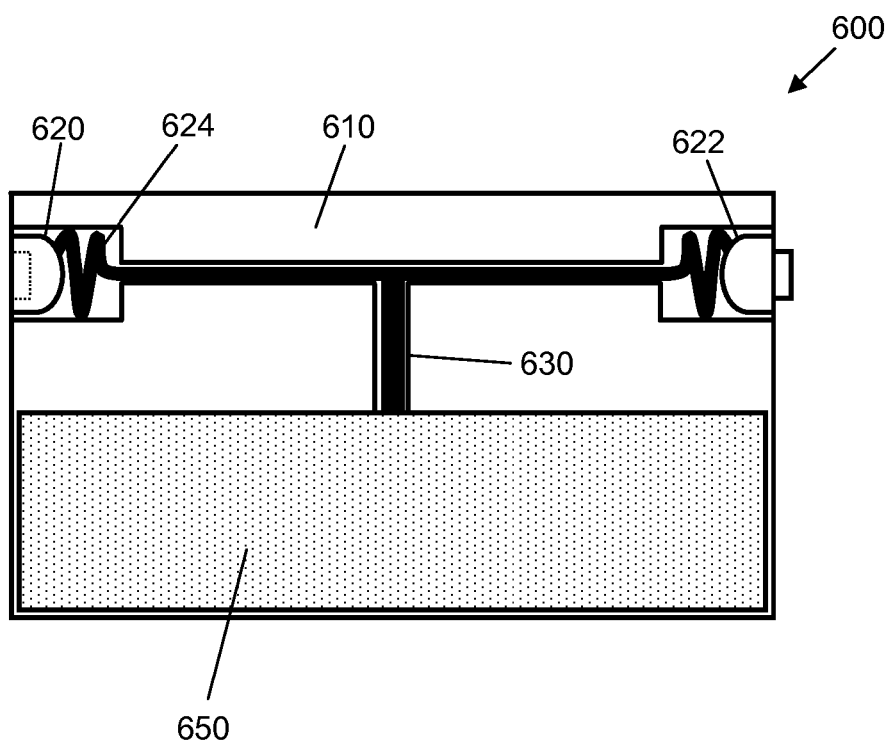
FIG. 6 is a schematic top view of a photovoltaic roofing element according to another embodiment of the invention.

Another embodiment is shown in top schematic view in FIG. 6. In photovoltaic roofing element 600, the flexible roofing substrate 610 has a recess 630 which is adapted to at least partially receive not only the mating electrical connectors 620 and 622, but also the wires 624 that operatively connect them to the photovoltaic element 650. In this embodiment, the wires can be relatively thick, but still not cause distortion of overlying layers of flexible roofing materials. In other embodiments, the recess can be shaped to at least partially receive other electrical connectors, such as bypass diodes and junction boxes.

Figure 7:
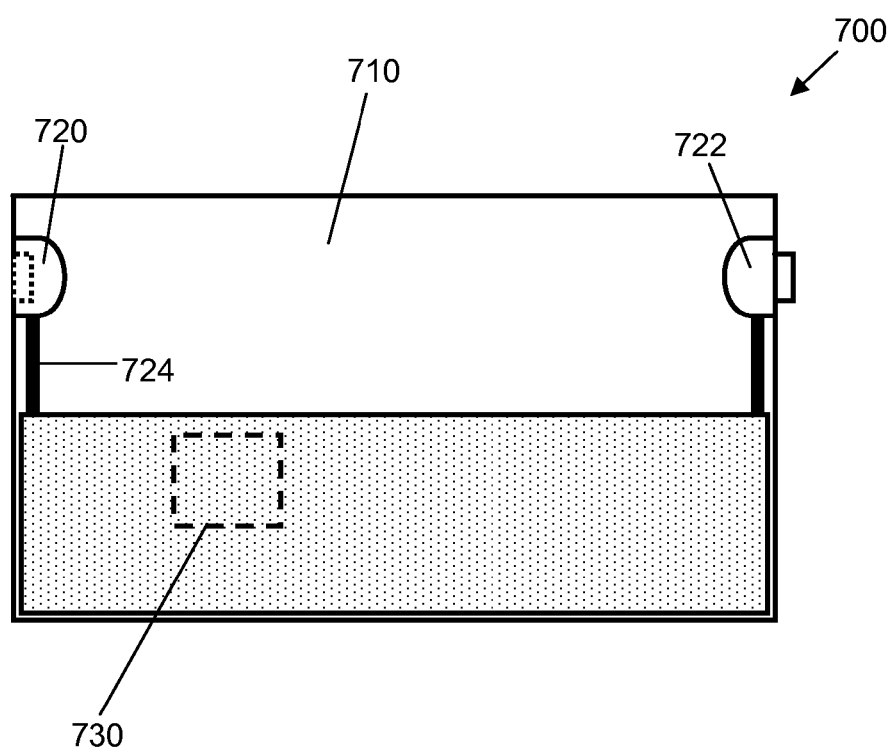
FIG. 7 is a schematic top view of a photovoltaic roofing element according to another embodiment of the invention.

Another embodiment is shown in top schematic view in FIG. 7. In this embodiment, the recess 730 is formed in a bottom surface of the flexible roofing substrate. The mating electrical connectors 720, 722 and the wires 724 are disposed on the top surface of the flexible roofing substrate 710. In this embodiment, the recess is of a shape to at least partially receive the electrical connectors. However, when installed, the mating electrical connectors of this photovoltaic roofing element 700 will not be disposed within the recess 730. Rather, as will be described in more detail with reference to FIG. 18, in use the recess 730 of this photovoltaic roofing element can at least partially receive the electrical connectors of a similar, underlying photovoltaic roofing element, and the electrical connectors 720, 722 of this photovoltaic roofing element 730 can be at least partially received by the recess of a similar, overlying photovoltaic roofing element.

Figure 8:
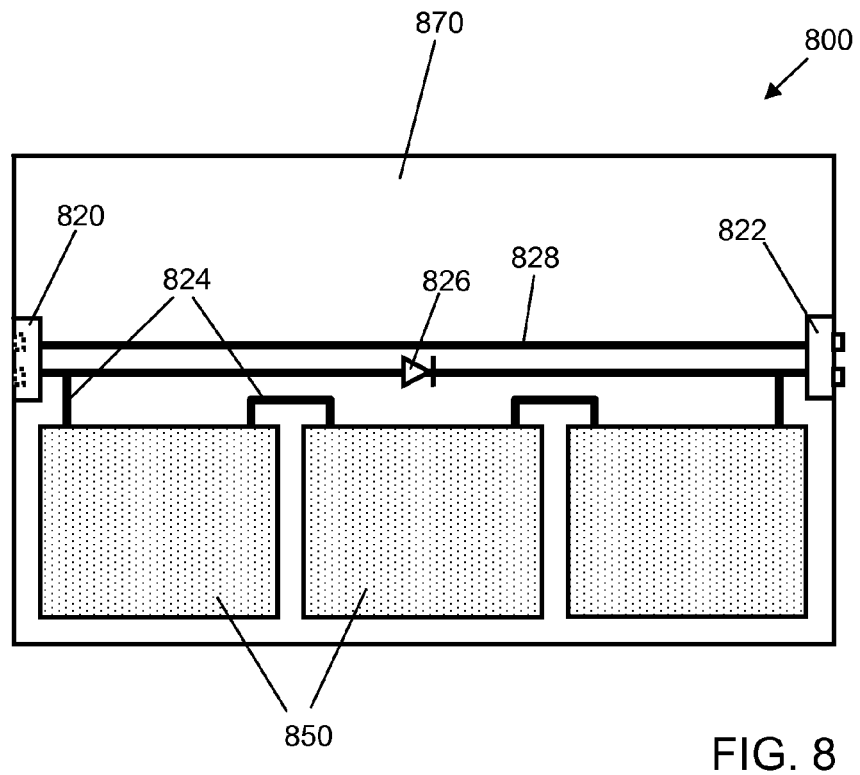
FIG. 8 is a schematic top view.
Figure 9:
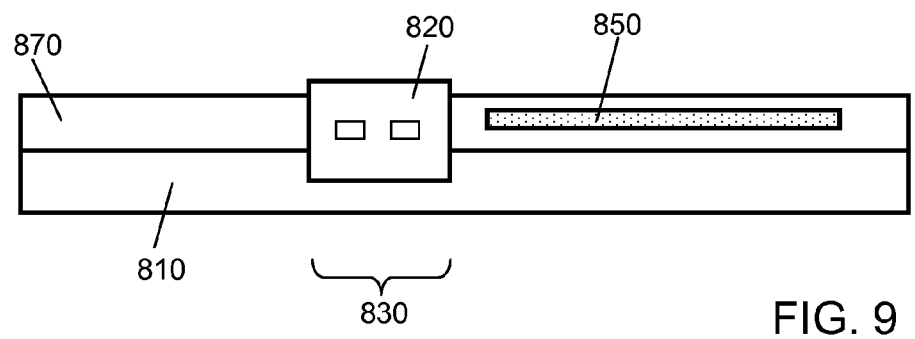
FIG. 9 is a schematic cross-sectional view of a photovoltaic roofing element according to another embodiment of the invention.

In other embodiments, as shown in top view in FIG. 8, and cross-sectional view in FIG. 9, the electrical connector is partially received within the recess, yet protrudes partially from the top face of the photovoltaic roofing element. In photovoltaic element 800, the photovoltaic elements 850 and their associated series interconnection wiring 824, bypass diode 826 and return electrical path wiring 828 mating electrical connectors 820, 822 are contained within a laminate or encapsulated structure 870, from which the mating electrical connectors protrude. The return electrical path wiring can allow for the mating electrical connectors to not only interconnect the photovoltaic elements of adjacent photovoltaic roofing elements in series, but also allow provide the return path for built-up power to the larger electrical system. The return path wiring can be as described in U.S. Provisional Patent Application Ser. No. 61/040,376, which is hereby incorporated herein by reference in its entirety. In the embodiment of FIG. 9, the mating electrical connectors protrude from both the bottom and top faces of the laminate structure. In other embodiments, the mating electrical connectors protrude only from the top surface, or only from the bottom surface of the laminate or encapsulated structure. In the embodiment of FIG. 9, the laminate structure 870 is disposed on a flexible roofing substrate 810. The flexible roofing substrate 810 has a recess 830 formed therein to receive the mating electrical connector 820; as well as a second recess formed therein (not shown in the cross-sectional view of FIG. 9) to receive the mating electrical connector 822. In certain embodiments, for example when the electrical connectors protrude significantly from the top face of the laminate or encapsulated structure, the flexible roofing substrate 810 can have a recess formed in its bottom surface, as described above with reference to FIG. 7 and below with reference to FIG. 18.

Figure 10:
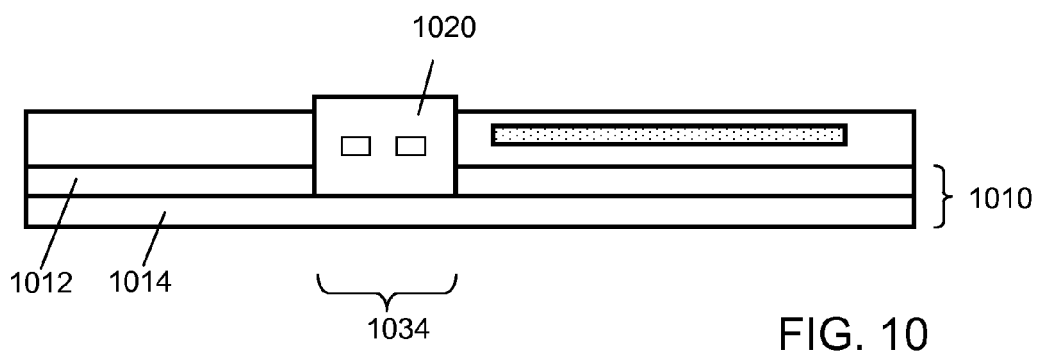
FIG. 10 is a schematic cross-sectional view of a photovoltaic roofing element according to another embodiment of the invention.

In certain embodiments, the flexible roofing substrate itself is made from a plurality of layers of material. In such embodiments, the various layers can be cut or notched differently to form the recess. For example, in the embodiment of FIG. 10, the flexible roofing substrate 1010 includes two layers of material (e.g., asphalt-impregnated fiberglass web, as used in conventional roofing shingles). In the first layer 1012, a notch 1034 (shown as a discontinuity in this cross-sectional view) is cut to receive the electrical connector 1020. The second layer 1014 underlies the first layer and the electrical connector. The overall effect of the notch 1034 and the underlying layer 1014 is that of a recess formed in the top surface of the flexible roofing substrate, as described above.

In certain embodiments of the invention, the wiring that operatively connects the mating electrical connectors to the photovoltaic element can have sufficient slack to allow the connectors to be lifted away from the flexible roofing substrate for easy interconnection with the mating electrical connector of another photovoltaic roofing element, or into a larger electrical system. In some such embodiments, the slack wire can be received by a recess in a flexible roofing substrate (i.e., either in the flexible roofing substrate of its own photovoltaic roofing element, or the flexible roofing substrate of an overlying flexible roofing substrate, as described above with reference to FIG. 7 and below with reference to FIG. 18. An example of this is shown in FIG. 6, in which the slack in wiring 624 is received by recess 630.

Figure 11:
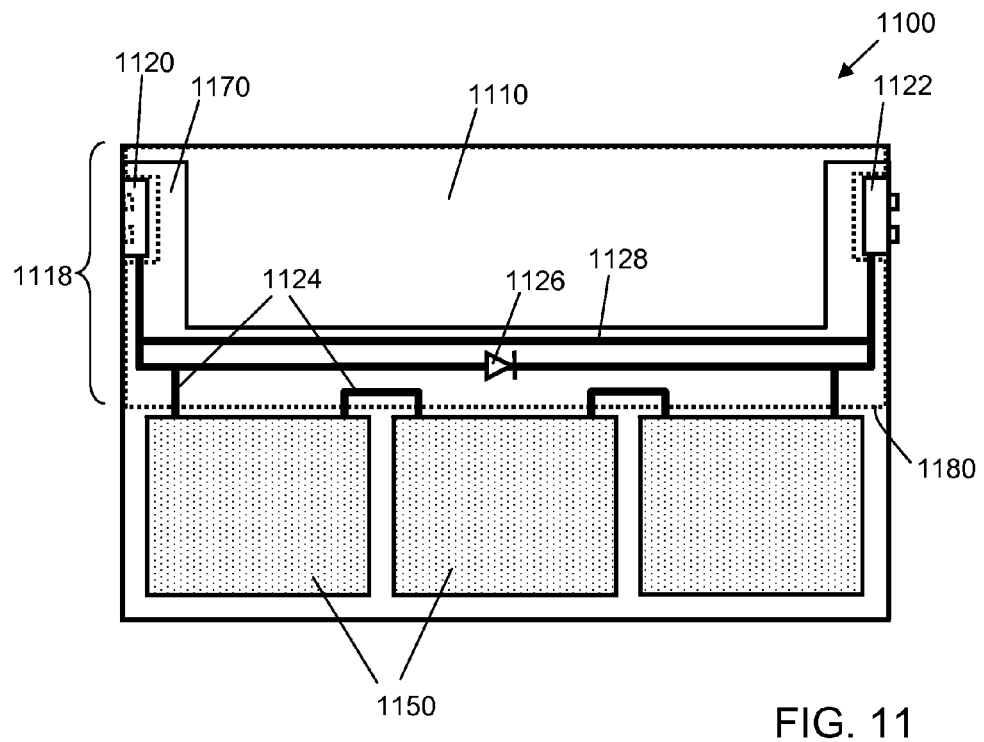
FIG. 11 is a schematic top view.
Figure 12:
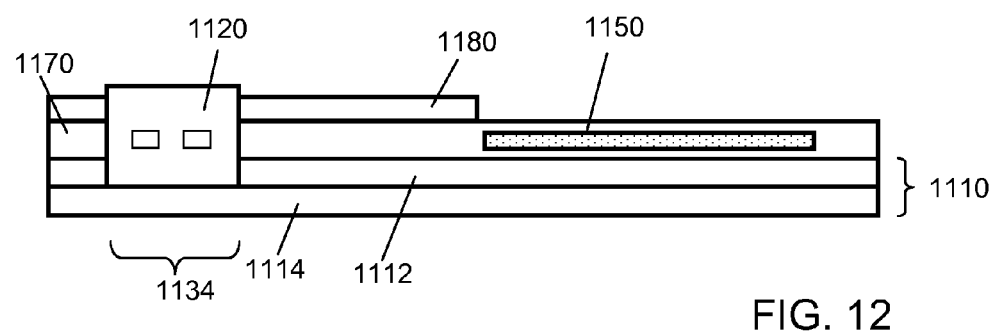
FIG. 12 is a schematic cross-sectional view of a photovoltaic roofing element according to another embodiment of the invention.

FIG. 11 is a top perspective schematic view, and FIG. 12 is a cross-sectional schematic view of a photovoltaic roofing element 1100 according to another embodiment of the invention. In this embodiment, the laminate or encapsulate structure 1170 has a reduced volume of encapsulant or laminating materials in the headlap zone of the structure (i.e., there is no encapsulant or laminating material in most of the headlap zone 1118 of the photovoltaic roofing element 1100). Such an arrangement can make more efficient use of costly encapsulant or laminating materials by encapsulating or laminating primarily the parts of the structure that include electrical wiring or photovoltaic materials, and generally avoiding the use of encapsulant or laminate materials in portions of the structure that will not be exposed to the weather. In other embodiments, wires or cables can connect the mating electrical connectors to a laminated or encapsulated photovoltaic element.

In the photovoltaic roofing element of FIGS. 11 and 12, the laminate or encapsulate structure 1170 includes photovoltaic elements 1150, bypass diode 1126, return path wiring 1128 and wiring 1124, as well as mating electrical connectors 1120, 1122. The mating electrical connectors protrude both and above and below the laminate or encapsulate structure. The flexible roofing substrate 1110 includes a first layer 1112 which has a notch 1134 cut therein to receive the mating electrical connector 1120, and a second layer 1114 which underlies the first layer. In certain embodiments, the first layer merely has a recess formed therein, instead of a notch formed through its entire thickness. The second layer does not have notches in the vicinity of the mating electrical connectors, thus providing closure and a water and weather proofing of the photovoltaic roofing element. The photovoltaic roofing element 1100 also includes a top layer of flexible roofing material 1180 (shown in dotted outline in FIG. 11) in the headlap zone, which has a notch formed therein to accommodate the mating electrical connectors. In this embodiment, the mating electrical connectors protrude only slightly above the top layer of flexible roofing material, and when installed has little effect on the aesthetics of an overlying photovoltaic roofing element. In other embodiments, the second layer of the flexible roofing substrate has a hole cut therein, to form a recess formed in the bottom surface of the flexible roofing substrate, as described above with reference to FIG. 7 and below with reference to FIG. 18.

Figure 13:
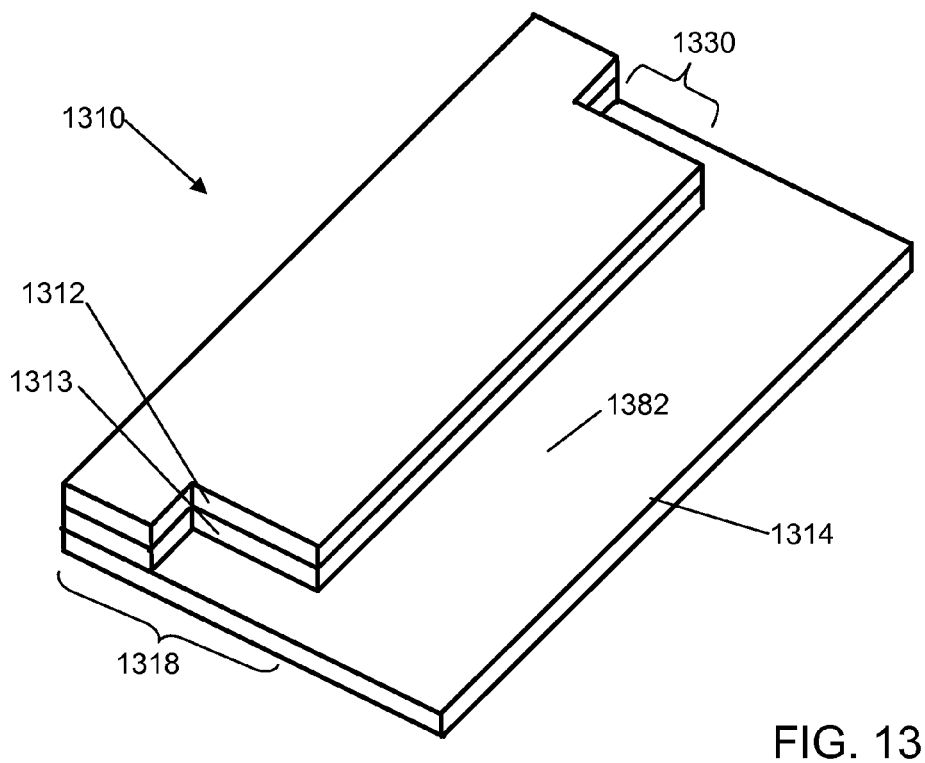
FIG. 13 is a schematic top perspective view of a flexible roofing element suitable for use in one embodiment of the invention.
Figure 14:
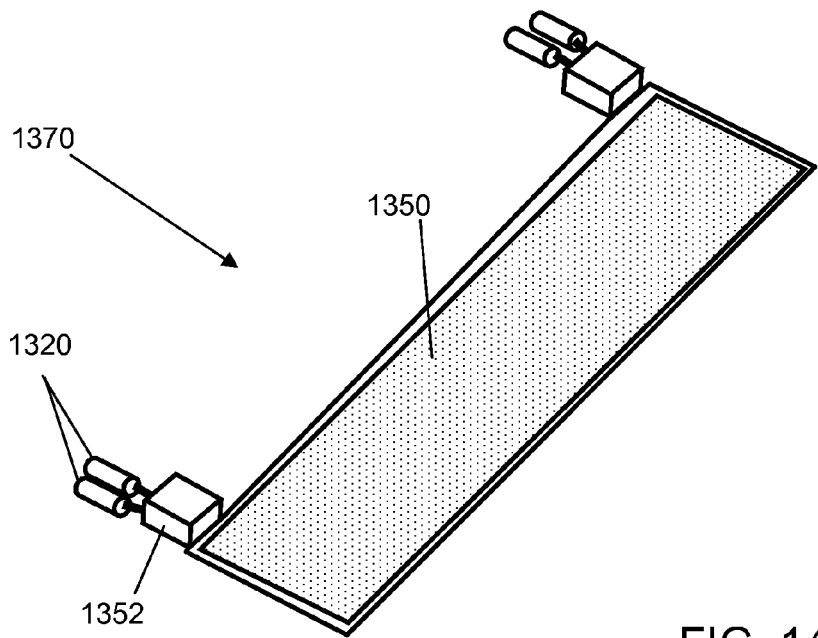
FIG. 14 is a schematic top perspective view of a photovoltaic element suitable for use in one embodiment of the invention.
Figure 15:
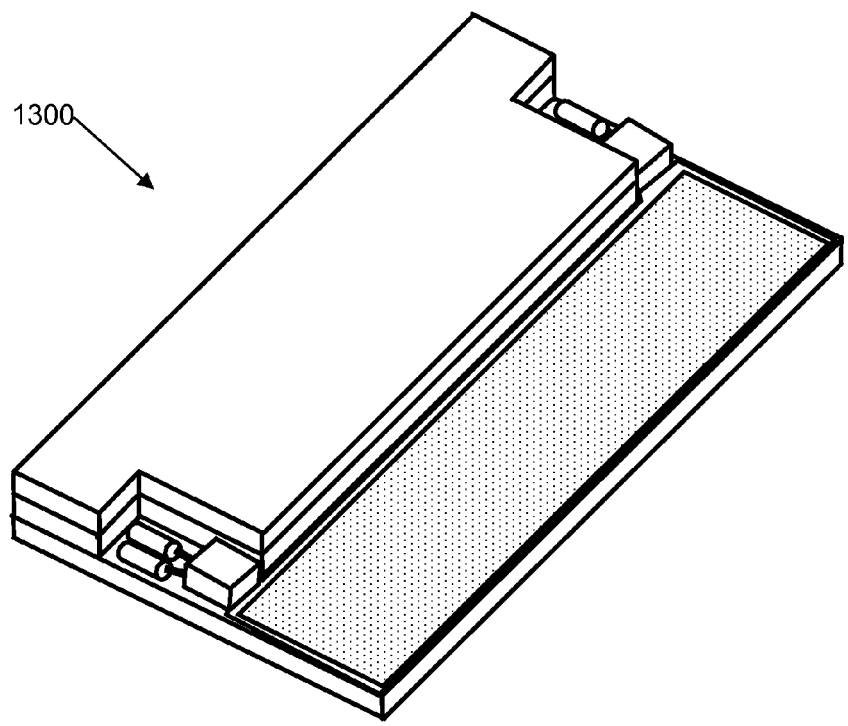
FIG. 15 is a schematic top perspective view of a photovoltaic roofing element according to one embodiment of the invention, made using the flexible roofing element of FIG. 13 and the photovoltaic element of FIG. 14.

FIGS. 13, 14 and 15 are top perspective schematic views of a photovoltaic roofing element and its components according to another embodiment of the invention. FIG. 13 shows a flexible roofing substrate 1310, which has a first layer 1312, a second layer 1313 and a third layer 1314. The first and second layers are only in the headlap zone 1318, and have corners cut out to provide a recess 1330 for electrical connectors. The third layer forms a support base for the entire photovoltaic roofing element, and can have a photovoltaic receptor zone 1382 that is adapted to receive a photovoltaic element, for example as described in U.S. Provisional Patent Application Ser. No. 61/043,707 filed Apr. 9, 2008, in U.S. Provisional Patent Application Ser. No. 61/014,902 filed Dec. 19, 2007 and in U.S. Patent Application Publication no. 2009/0159118, each of which is hereby incorporated herein by reference in its entirety. As described above, the flexible roofing substrate 1310 can be formed from, for example, asphalt-impregnated fiberglass web materials, as are common in the roofing arts. FIG. 14 shows a photovoltaic element 1350 in a laminate structure 1370. Junction boxes 1352 interconnect the photovoltaic element to mating electrical connectors 1320. The junction box can also, in some embodiments, include a bypass diode.

FIG. 15 shows a photovoltaic roofing element 1300 assembled from the laminate structure of FIG. 14 and the flexible roofing substrate of FIG. 13. In one embodiment the assembly is pre-assembled in a manufacturing environment. In another embodiment, the assembly is assembled in the field, the flexible roofing substrate having a receptor zone as described in U.S. Provisional Patent Application Ser. No. 61/043,707 filed Apr. 9, 2008, in U.S. Provisional Patent Application Ser. No. 61/014,902 filed Dec. 19, 2007 and in U.S. Patent Application Publication no. 2009/0159118, each of which is hereby incorporated herein by reference in its entirety.

Asphalt shingle constructions are known in the shingle art and can be used as the flexible roofing substrates in various aspects of the present invention. Alternatively, other flexible base materials such as elastomeric membrane, polyvinylchloride membrane, thermoplastic polyolefin membrane or other flexible polymeric materials may be used.

Figure 16:
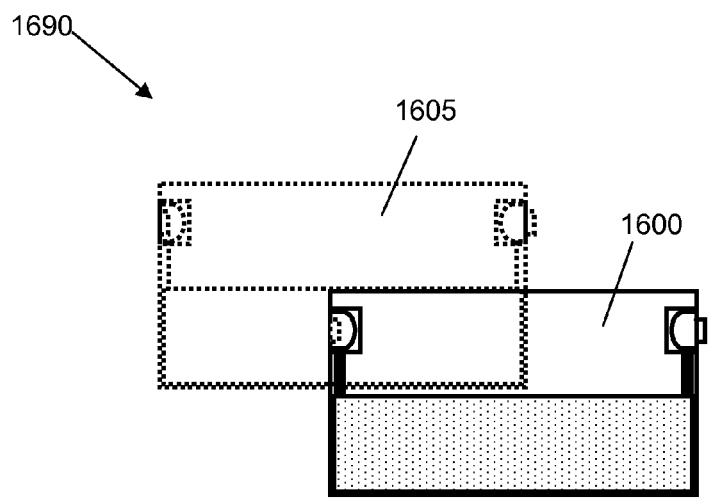
FIG. 16 is a schematic top view of a photovoltaic roofing system according to one embodiment of the invention.

Another aspect of the invention is shown in top schematic view in FIG. 16. Photovoltaic roofing system 1690 includes a first photovoltaic roofing element 1600, which comprises a flexible roofing substrate, a photovoltaic element disposed on the flexible roofing substrate, and an electrical connector operatively coupled to the photovoltaic element, as described above. Photovoltaic roofing system 1690 further comprises a second photovoltaic roofing element 1605, shown in dotted outline, which comprises a flexible roofing substrate, a photovoltaic element disposed on the flexible roofing substrate, and an electrical connector operatively coupled to the photovoltaic element, as described above. The second photovoltaic roofing element 1605 is disposed so as to cover the electrical connector of the first photovoltaic roofing element. In certain embodiments, the electrical connectors of the first photovoltaic roofing element are at least partially disposed within a recess formed in the flexible roofing substrate of the first photovoltaic roofing element (e.g., in a top or along a side thereof); within a recess formed in the flexible roofing substrate of the second photovoltaic roofing element (e.g., in a bottom surface thereof); or within a recess formed in the flexible roofing substrate of the first photovoltaic roofing element and within a recess formed in the flexible roofing substrate of the second photovoltaic roofing element. The photovoltaic roofing system can, for example, be disposed on a roof deck.

Figure 17:
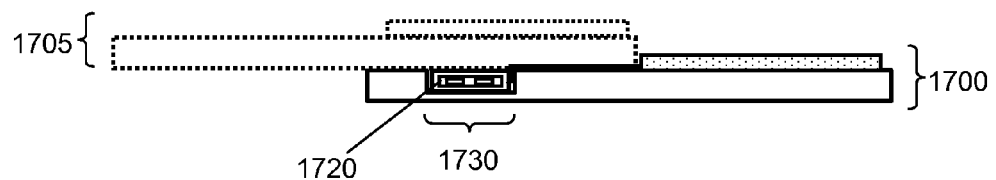
FIG. 17 is a schematic cross-sectional view of a photovoltaic roofing system according to one embodiment of the invention.

For example, in certain embodiments, as shown in side cross-sectional view in FIG. 17, the flexible roofing substrate of the first photovoltaic roofing element 1700 has a recess 1730 formed in its top surface or along a side, in which the electrical connector of the first photovoltaic roofing element is at least partially disposed. Such a photovoltaic roofing element is described, for example, with reference to FIGS. 3 and 4, above. In FIG. 17, the electrical connector 1720 of first photovoltaic roofing element 1700 is covered by second photovoltaic roofing element 1705 (shown in dotted outline). As the person of skill in the art will understand, the recesses (e.g., cutouts or notches) can advantageously be disposed so that, when installed, they are aligned in a way to minimize the formation of water pathways through the flexible roofing substrates.

Figure 18:
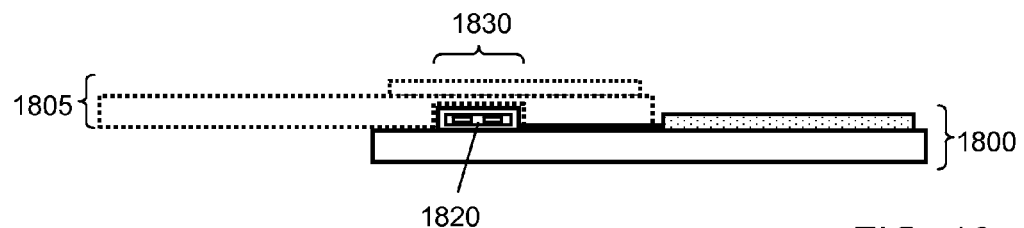
FIG. 18 is a schematic cross-sectional view of a photovoltaic roofing system according to another embodiment of the invention.

Another aspect of the invention is a photovoltaic roofing system comprising: a first photovoltaic roofing element, the first photovoltaic roofing element comprising a flexible roofing substrate, a photovoltaic element disposed on the flexible roofing substrate, and an electrical connector operatively coupled to the photovoltaic element; and a second photovoltaic roofing element disposed adjacent the first photovoltaic roofing element, the second photovoltaic roofing element comprising: a flexible roofing substrate having a recess formed therein, the electrical connector of the first photovoltaic roofing element being at least partially disposed in the recess, a photovoltaic element disposed on the flexible roofing substrate, and an electrical connector operatively coupled to the photovoltaic element. For example, as shown in side cross-sectional view in FIG. 18, the flexible roofing substrate of the second photovoltaic roofing element has a recess formed in its bottom surface, in which the electrical connector of the first photovoltaic roofing element is at least partially disposed. Such a photovoltaic roofing element is described, for example, with reference to FIG. 7, above. In FIG. 18, the electrical connector 1820 of the first photovoltaic roofing element 1800 is disposed in a recess 1830 formed in the bottom side of the flexible roofing substrate of the second photovoltaic roofing element 1805 (shown in dotted outline). While not shown in this cross-sectional view (due to the lateral offset between the photovoltaic roofing elements as shown in FIG. 16), the second photovoltaic roofing element can have a electrical connector, and the first photovoltaic roofing element can have a recess formed in the bottom surface of its flexible roofing substrate. For example, the first and second photovoltaic roofing elements can be the same. As the person of skill in the art will appreciate, the position of the recess will depend on the positions of the electrical connectors as well as the intended configuration (i.e., lateral offset between courses, degree of overlap between courses) of the photovoltaic roofing elements in a larger photovoltaic roofing system. For example, if a photovoltaic roofing element has its electrical connectors at a higher position (i.e., closer to the roof ridge end of the photovoltaic roofing element), a recess on the bottom surface would be at a different location than for embodiments having electrical connectors at a lower position. For photovoltaic roofing elements to be applied with a consistent lateral offset during installation, a recess can be appropriately located so as to be able to receive the electrical connectors of an underlying course. For photovoltaic roofing elements that are to be applied with an alternating offset, such as in a racked-type installation, it may be that they include two recesses, one toward a left end and one toward a right end so that the same photovoltaic roofing elements may be used as courses are built up on the roof with alternating left and right offsets in the installation pattern.

Figure 19:
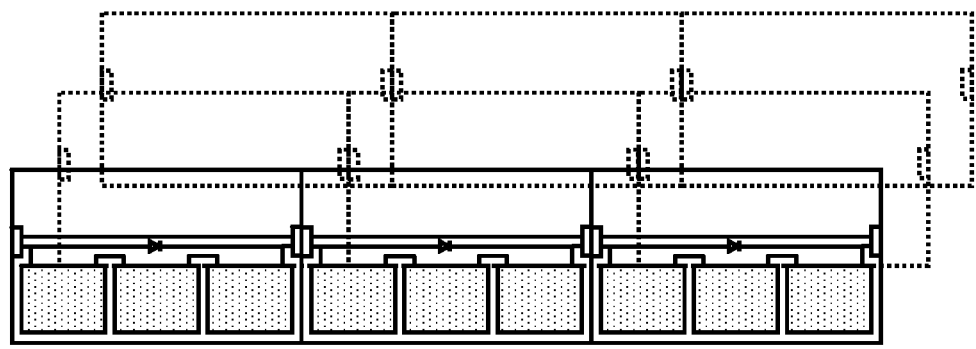
FIGS. 19 and 20 are a schematic top views of photovoltaic roofing systems according to various embodiments of the invention.

FIG. 19 shows a photovoltaic roofing system comprising an array of photovoltaic roofing elements as described herein. The photovoltaic roofing elements are disposed in a laterally-offset fashion as sequential courses are applied on a roof deck (roof deck not shown). As the person of skill in the art will understand, the number of courses and the number of photovoltaic roofing elements per course will depend on the size of the roof area to be covered, and may include more or fewer courses than three, and more or fewer photovoltaic roofing elements per course than three. In FIG. 19, the upper two courses are shown in dotted outline, so as to show the locations of the structural details of the underlying courses, including the locations of the electrical connectors and interconnections between photovoltaic roofing elements. As described in detail above, the electrical connectors can be disposed within recesses formed in the photovoltaic roofing elements of which they are a part, within recess formed in overlying photovoltaic roofing elements, or (advantageously for relatively thick electrical connectors) both.

Figure 20:
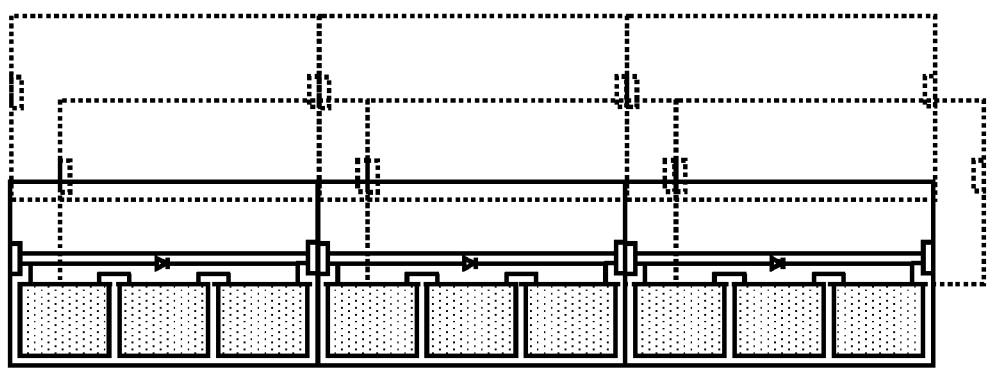

FIG. 20 shows a photovoltaic roofing system similar to that of FIG. 19, in which the photovoltaic roofing elements are disposed in a racked configuration, in which the laterally offset disposition as sequential courses are applied on a roof deck (roof deck not shown) alternates from left to right relative to the underlying course moving up the roof.

One aspect of the invention is a photovoltaic roofing element including a flexible roofing substrate, the flexible roofing substrate including a base of flexible roofing material having a top surface, the top surface having a headlap zone and an exposure zone, and one or more layers of shim material disposed on the top surface of the base in the headlap zone; a photovoltaic element disposed on the top surface of the base; and an electrical connector operatively connected to the photovoltaic element and disposed on the top surface of the base, wherein the one or more layers of shim material have a total thickness at least about as great as the thickness of the electrical connector. That is, the combined thicknesses of the one or more layers of shim material is at least about as great as the thickness of the electrical connector.

For example, the total thickness of the one or more layers of shim material can be about equal to (e.g., within 20% of, or even within 10% of) the thickness of the electrical connector. As used herein, the headlap zone is the area that is covered by overlying courses of roofing elements when installed; and the exposure zone is the area that is not covered by overlying courses of roofing elements when installed.

In one embodiment, the one or more layers of shim material have a stair-step configuration, for example with the region of greatest thickness disposed adjacent the electrical connector. In such an embodiment, the stair-step can provide a gradual slope to an overlying flexible roofing element.

In one embodiment, the one or more layers of shim material have a notch or recess formed therein, in which the connector is positioned.

Another aspect of the invention is a photovoltaic roofing element including a flexible roofing substrate, the flexible roofing substrate including a base of flexible roofing material having a top surface and a bottom surface, the top surface having a headlap zone and an exposure zone; and one or more layers of shim material disposed on the bottom surface of the flexible roofing substrate; a photovoltaic element disposed on the top surface of the base; and an electrical connector operatively connected to the photovoltaic element and disposed on the top surface of the base, wherein the one or more layers of flexible roofing material have a total thickness at least about as great as the thickness of the electrical connector.

For example, the total thickness of the one or more layers of flexible roofing material can be about equal to (e.g., within 20% of, or even within 10% of) the thickness of the electrical connector.

In certain embodiments, the photovoltaic roofing element includes a plurality of electrical connectors, for example, mating electrical connectors, junction boxes, bypass diodes, wiring and/or cabling. Any or all of the electrical connectors can be protected by the shim layers as described herein.

In one embodiment, the one or more layers of shim material are positioned so that, when installed, the electrical connector of an underlying photovoltaic roofing element is disposed adjacent the one or more layers. In some embodiments, a sealing layer for containment and waterproofing of the connector element is provided.

In one embodiment, the one or more layers of flexible roofing material have a stair-step configuration, for example with the region of greatest thickness positioned so that, when installed, the electrical connector of an underlying photovoltaic roofing element is disposed adjacent the region of greatest thickness.

In one embodiment, the one or more layers of flexible roofing material have a notch or recess formed therein, positioned so that, when installed, the electrical connector of an underlying photovoltaic roofing element is disposed therein.

Another aspect of the invention is photovoltaic roofing system comprising a plurality of photovoltaic roofing elements as described herein electrically interconnected and disposed on a roof.

Figure 21:
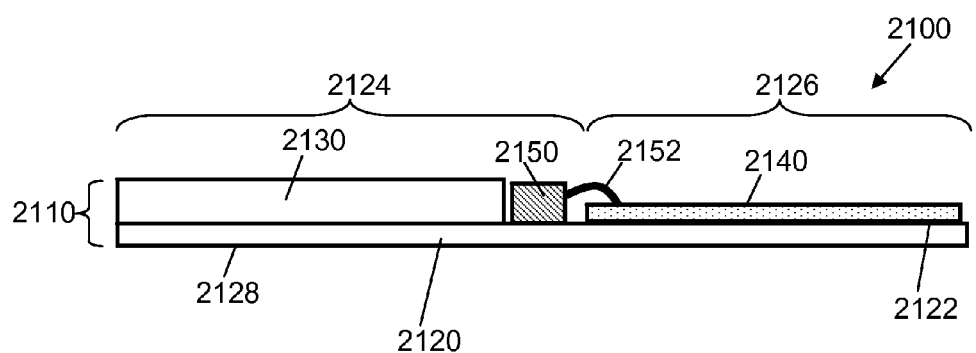
FIG. 21 is a schematic cross-sectional view.
Figure 22:
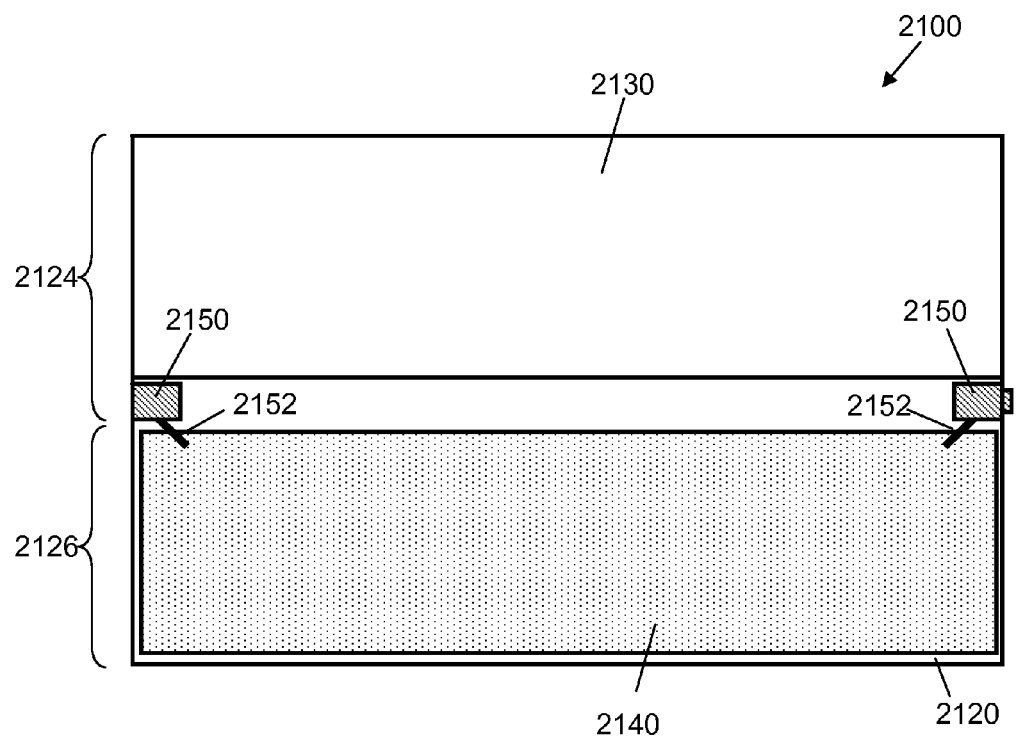
FIG. 22 is a schematic top view of a photovoltaic roofing element according to one embodiment of the invention.

One embodiment of the invention is shown in side schematic cross-sectional view in FIG. 21, and in top schematic view in FIG. 22. A photovoltaic roofing element 2100 includes flexible roofing substrate 2110, which in turn includes a base of flexible roofing material 2120, which has top surface 2122 having a headlap zone 2124 and an exposure zone 2126, and a bottom surface 2128; and a layer of shim material 2130 disposed on the top surface of the base in the headlap zone. The photovoltaic roofing element 2100 also includes a photovoltaic element 2140 disposed on the top surface of the base in the exposure zone, and an electrical connector 2150 disposed on the base and operatively coupled (e.g., through cable 2152) to the photovoltaic roofing element. The layer of shim material 2130 has a total thickness at least about as great as the thickness of the electrical connector 2150. For example, in the embodiment of FIGS. 21 and 22, the thickness of the layer of shim material is about equal to the thickness of the electrical connector.

In the embodiment of FIGS. 21 and 22, the electrical connector is shown as sitting entirely on top of the base of flexible roofing material. In other embodiments, the electrical connector can be partially embedded in the roofing material, or be partially disposed in a recess pre-formed therein.

The cable 2152 can be round in cross section, or in certain embodiments can have a flat cross-section (e.g., a relatively flat ribbon of metal clad in a plastic coating). The person of skill in the art can select a flat cable having sufficient electrical properties for the transmission of electric power through the photovoltaic system. A flat cable can be folded over so as to lie flat, and can be easily bent to change direction. Advantageously, the flat cable can lie between photovoltaic roofing elements without causing a protrusion.

Figure 23:
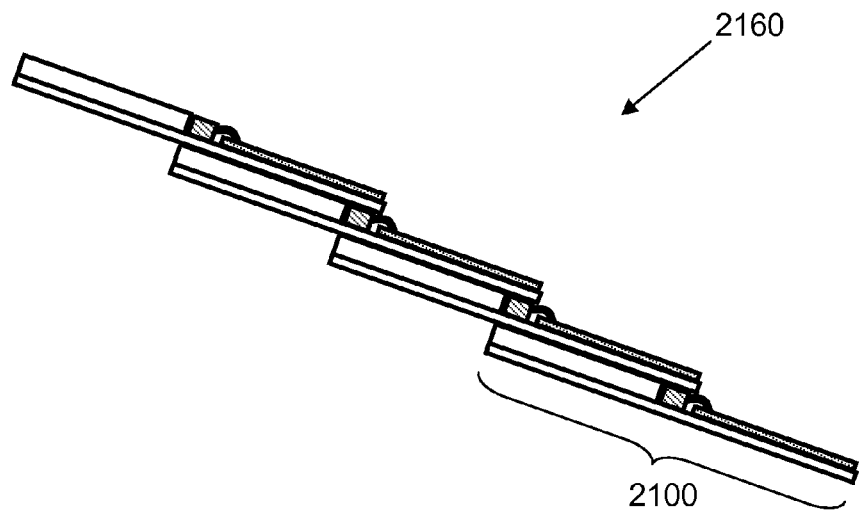
FIG. 23 is a schematic cross-sectional view of a photovoltaic roofing system according to one embodiment of the invention.

FIG. 23 is a cross-sectional schematic view of a photovoltaic roofing system 2160, which comprises a plurality of photovoltaic roofing elements 2100 as described above with reference to FIGS. 21 and 22. Overlying courses of photovoltaic roofing elements lay flat on top of the shim material, so that the electrical connector itself does not protrude, and is therefore more protected from damage. In cases where the shim material is flexible (e.g., when it is made from flexible roofing material such as that used for the base), the headlap portion of the can flex to contact the roof (not shown). The photovoltaic roofing system can be disposed on a roof deck and interconnected with an electrical system to form a photovoltaic roofing system.

Figure 24:
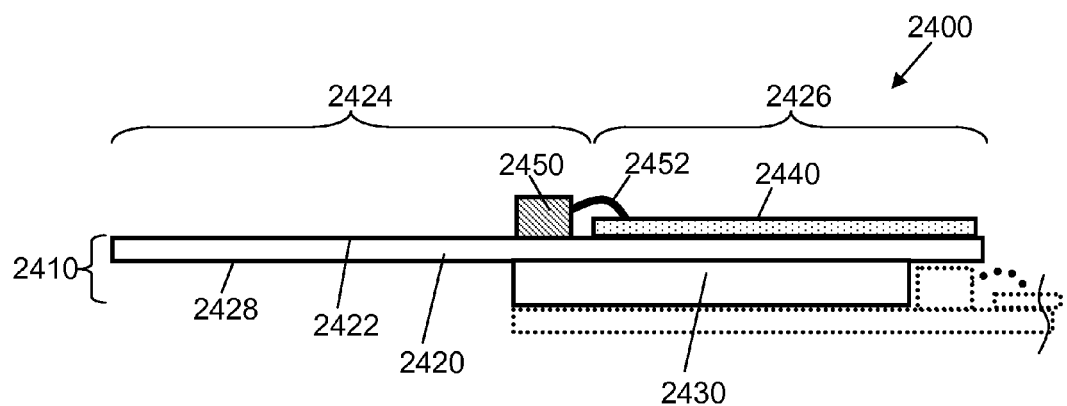
FIG. 24 is a schematic cross-sectional view.
Figure 25:
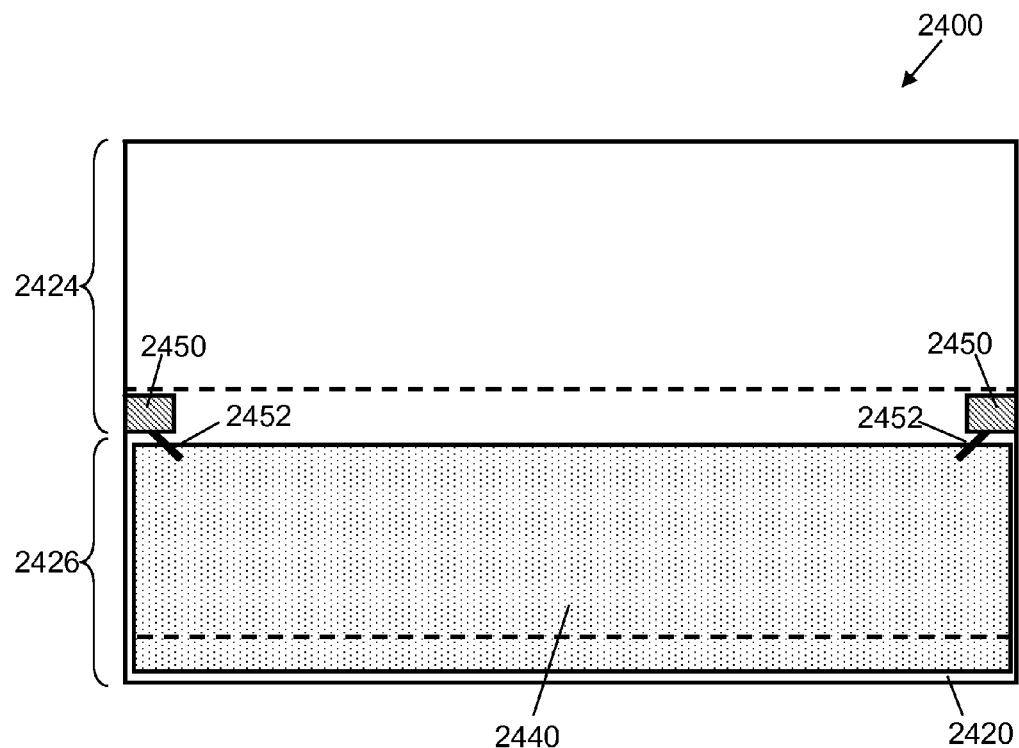
FIG. 25 is a schematic top view of a photovoltaic roofing element according to one embodiment of the invention.

Another embodiment of the invention is shown in side schematic cross-sectional view in FIG. 24, and in top schematic view in FIG. 25. A photovoltaic roofing element 2400 includes flexible roofing substrate 2410, which in turn includes a base of flexible roofing material 2420, which has top surface 2422 having a headlap zone 2424 and an exposure zone 2426, and a bottom surface 2428; and a layer of shim material 2430 disposed on the bottom surface of the base. The photovoltaic roofing element 2400 also includes a photovoltaic element 2440 disposed on the top surface of the base, and an electrical connector 2450 disposed on the base and operatively coupled (e.g., through cable 2452) to the photovoltaic roofing element. The layer of shim material 2430 (position shown in dashed line in FIG. 25) has a total thickness at least about as great as the thickness of the electrical connector 2450. For example, in the embodiment of FIGS. 24 and 25, the thickness of the layer of shim material is about equal to the thickness of the electrical connector. Notably, in the embodiments of FIGS. 24-25, the layer of shim material is positioned so that, when installed, the electrical connector of an underlying photovoltaic roofing element (shown in dotted lines) is disposed adjacent the layer of shim material.

Figure 26:
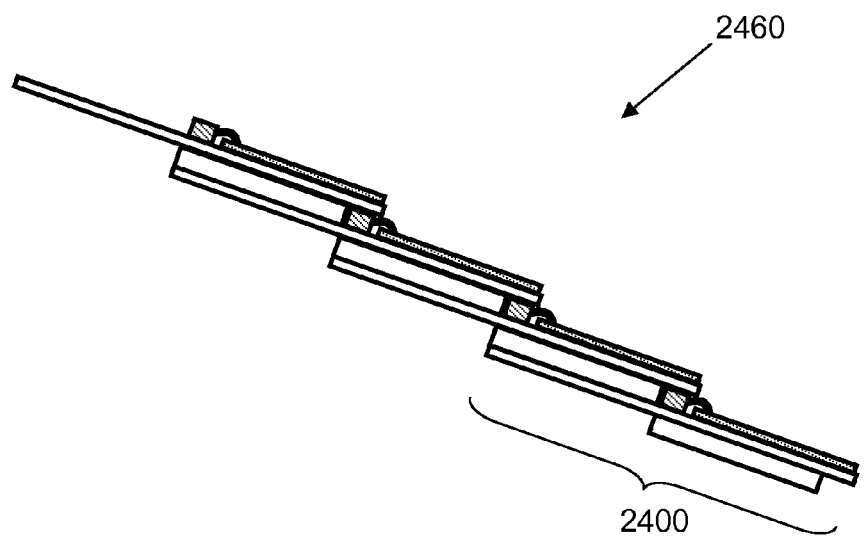
FIG. 26 is a schematic cross-sectional view of a photovoltaic roofing system according to one embodiment of the invention.

FIG. 26 is a cross-sectional schematic view of a photovoltaic roofing system 2460, which comprises a plurality of photovoltaic roofing elements 2400 as described above with reference to FIGS. 24 and 25. Overlying courses of photovoltaic roofing elements lay on top of the shim material, with any bump or protrusion formed by the shim material, so that the electrical connector itself does not protrude, and is therefore more protected from damage.

Figure 27:
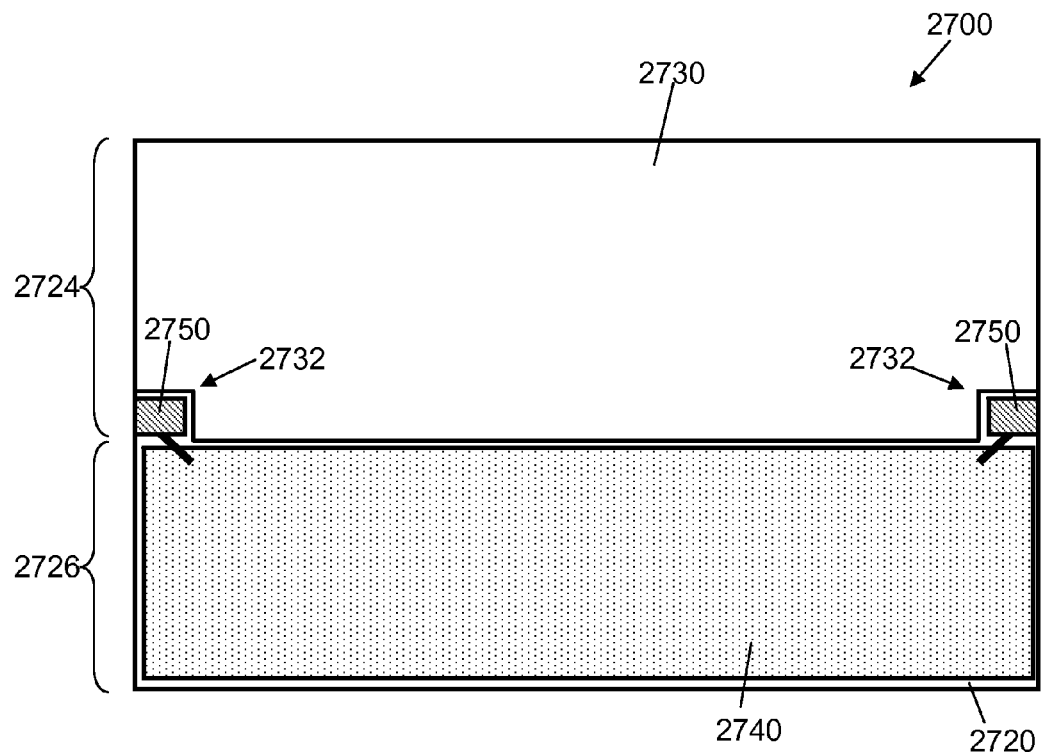
FIG. 27 is a schematic top view of a photovoltaic roofing element according to another embodiment of the invention.

The shim material can have a shape that provides a recess (e.g., notch or cut-away) into which the connector can fit. For example, as shown in top schematic view in FIG. 27, a photovoltaic roofing element 2700 includes flexible roofing substrate, which in turn includes a base of flexible roofing material 2720, which has top surface having a headlap zone 2724 and an exposure zone 2726, and a bottom surface (not shown in this view); and a layer of shim material 2730 disposed on the top surface of the base in the headlap zone. The photovoltaic roofing element 2700 also includes a photovoltaic element 2740 disposed on the top surface of the base in the exposure zone, and an electrical connector 2750 disposed on the base and operatively coupled to the photovoltaic roofing element. The layer of shim material 2730 has a total thickness at least about as great as the thickness of the electrical connector 2750. In the embodiment of FIG. 27, the shim material has cutaways 2732 in which the electrical connectors 2750 are disposed.

The shim material can be any of a variety of materials. For example, in order to provide for ease of manufacturing in conventional roofing shingle production processes, the shim materials can be layers of asphalt shingle material. In other embodiments, the shim material can be plastic. The shim material can, for example, include recycled content, such as recycled plastic, recycled asphalt, or other recycled roofing materials. Layers of different shim materials can be mixed in a single photovoltaic roofing element according to one embodiment of the invention.

Figure 28:
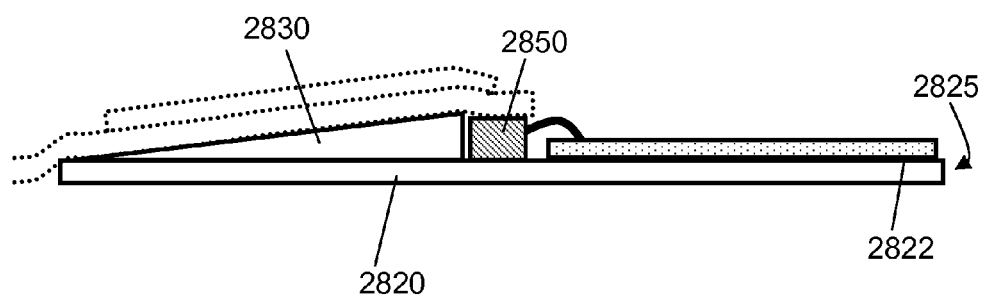
FIG. 28 is a schematic cross-sectional view of a photovoltaic roofing element according to one embodiment of the invention.
Figure 29:
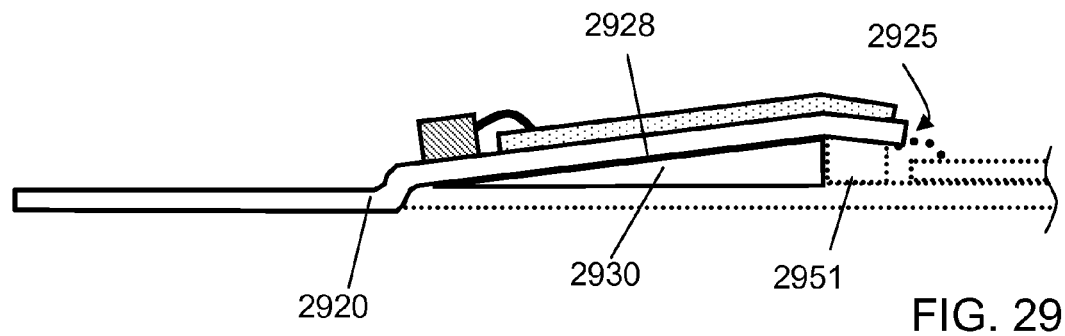
FIG. 29 is a schematic cross-sectional view of a photovoltaic roofing system according to one embodiment of the invention.

In one embodiment, the one or more layers of shim material have a slanted profile that provides a relatively gradual slope to an overlying roofing element. For example, as shown in side schematic cross-sectional view in FIG. 28, a layer of shim material 2830 disposed on top surface 2822 of the base of roofing material 2820 is slanted at its end furthest from the down-roof edge 2825 of the base of roofing material, so that an overlying roofing element (shown in dotted outline) can more gradually slope over the electrical connector 2850. Similarly, as shown in side schematic cross-sectional view in FIG. 29, a layer of shim material 2930 disposed on the bottom surface 2928 of a base of roofing material 2920 can be slanted at its end furthest from the down-roof edge 2925 of the base of roofing material, so that the base of roofing material can more gradually slope over the electrical connector 2951 of an underlying photovoltaic roofing element (shown in dotted line).

Figure 30:
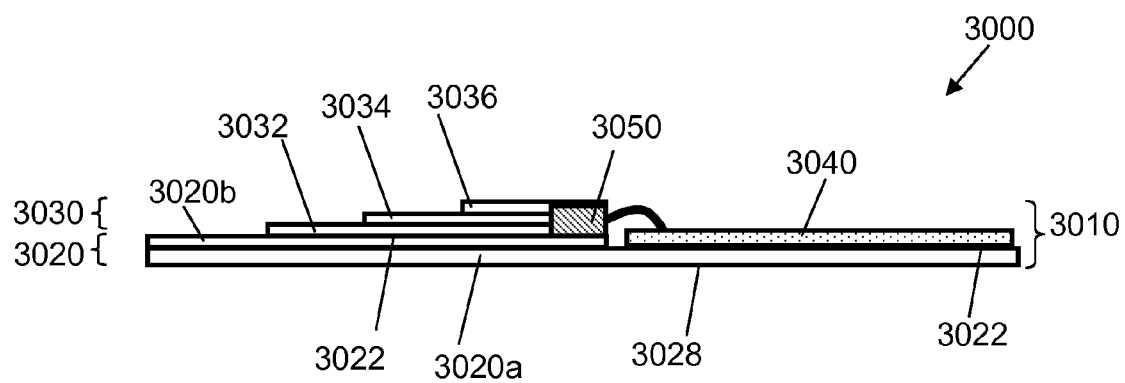
FIG. 30 is a schematic cross-sectional view.
Figure 31:
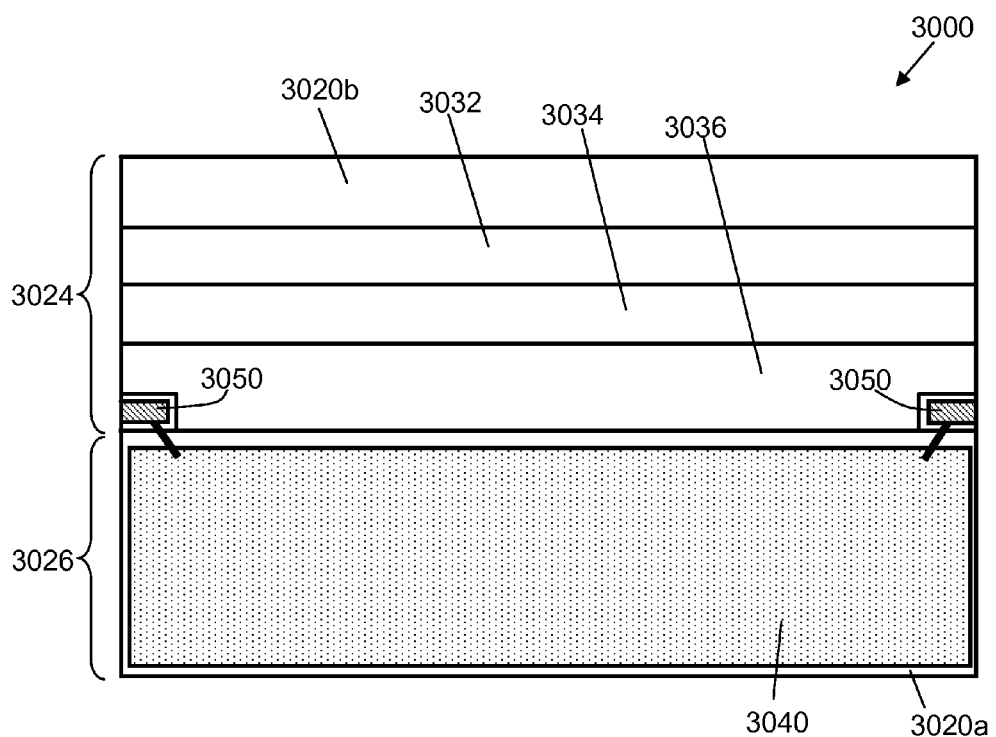
FIG. 31 is a schematic top view of a photovoltaic roofing element according to another embodiment of the invention.

In another embodiment, the one or more layers of shim material have a stair-step profile. The stair-step profile can provide a relatively gradual slope as described above with reference FIGS. 28 and 29, and can be made more simply, for example, using methods used conventionally in the production of roofing products. In one embodiment, shown in side schematic side view in FIG. 30 and in schematic top view in FIG. 31, photovoltaic roofing element 3000 includes flexible roofing substrate 3010, which in turn includes a base of flexible roofing material 3020, which has top surface 3022 having a headlap zone 3024 and an exposure zone 3026, and a bottom surface 3028. Base 3020 in this embodiment is made of two layers of roofing material (e.g., reinforced asphalt), a first layer 3020a that forms the bottom of the entire photovoltaic roofing element, and a second layer 3020b that is formed only in the headlap zone. The flexible roofing substrate 3010 further includes a stack 3030 of three layers of shim material 3032, 3034 and 3036 disposed in a stair-step configuration on the top surface of the base in the headlap zone. The layers 3032, 3034 and 3036 have corners cut out to form recesses for electrical connectors. The photovoltaic roofing element 3000 also includes a photovoltaic element 3040 disposed on the top surface of the base, and an electrical connector 3050 disposed on the base (here, on the second layer 3020b) and operatively coupled to the photovoltaic roofing element. The stack of shim material 3030 has a total thickness at least about as great as the thickness of the electrical connector 3050. For example, in the embodiment of FIGS. 30 and 31, the total thickness of the layers of shim material is about equal to the thickness of the electrical connector. The electrical connector is disposed in a cutout region of the layers of shim material. In such embodiments, the flexible roofing substrate and shim materials can be formed from reinforced bituminous materials, like conventional (fiber) glass-reinforced or polyester or polyester/fiber glass composite asphalt materials.

In one embodiment, for example, a photovoltaic roofing element as described above with reference to FIGS. 30 and 31 has an overall height (i.e., distance down the roof from the top of the headlap zone 3024 to the bottom of the exposure zone 3026) of about 18". The first layer 3020a of the base has a height of 18", and the second layer 3020b has a height of 9.625". The three shim layers 3032, 3034, 3036 have heights of 7", 5" and 3", respectively.

Figure 32:
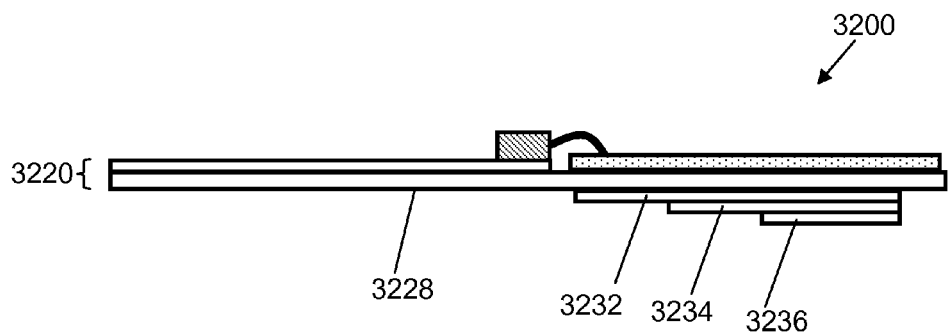
FIG. 32 is a schematic cross-sectional view of a photovoltaic roofing element according to another embodiment of the invention.

Similarly, as shown in the photovoltaic roofing element 3200 in FIG. 32, layers of shim material 3232, 3234, 3236 can be disposed in a stair-step fashion on the bottom surface 3228 of the base 3220 to allow it to more easily fit over a connector on an underlying course of photovoltaic elements, as described with reference to FIGS. 24-26 and 28.

In one embodiment the assembly is pre-assembled in a manufacturing environment. In another embodiment, the assembly is assembled in the field, the shingle support having a receptor zone as described in U.S. Provisional Patent Application Ser. No. 61/043,707 filed Apr. 9, 2008, in U.S. Provisional Patent Application Ser. No. 61/014,902 filed Dec. 19, 2007 and in U.S. Patent Application Publication no. 2009/0159118, the entirety of each of which is incorporated herein by reference.

Asphalt shingle constructions are known in the shingle art and can be used for the base material. Alternatively, other flexible base materials such as elastomeric membrane, polyvinylchloride membrane, thermoplastic polyolefin membrane or other flexible polymeric materials may be used. The shim materials can be the same as the flexible base materials, or may be different. When the shim materials are the same as the flexible base materials, the roofing substrates can be formed using multi-layer shingle production processes familiar to the person of skill in the art.

Another aspect of the invention is a photovoltaic system including a plurality of photovoltaic roofing elements as described above, electrically interconnected. The photovoltaic system (e.g., a photovoltaic roofing system) can be interconnected with an inverter to allow photovoltaically-generated electrical power to be used on-site, stored in a battery, or introduced to an electrical grid.

In certain embodiments of the invention a plurality of photovoltaic roofing elements are disposed on a roof deck and electrically interconnected to form a photovoltaic roofing system. There can be one or more layers of material (e.g. underlayment), between the roof deck and the photovoltaic laminates/roofing elements. The roof can also include one or more standard roofing elements, for example to provide weather protection at the edges of the roof, or in areas not suitable for photovoltaic power generation. In some embodiments, non-photovoltaically-active roofing elements are complementary in appearance or visual aesthetic to the photovoltaic roofing elements.

Any cabling interconnecting the photovoltaic roofing elements of the invention in a photovoltaic roofing system can, for example, be long and flexible enough to account for natural movement of a roof deck, for example due to heat, moisture and/or natural expansion/contraction.

It will be understood that power generated by the photovoltaic roofing systems described herein may be used to power the building itself or may be directed elsewhere on an electrical grid, as desired. Electrical systems for handling the photovoltaically-generated power are described, for example, in Ser. No. 11/743,073, which is hereby incorporated herein by reference in its entirety. Photovoltaic elements suitable for use in the present invention are described in, for example, in U.S. patent application Ser. No. 12/266,409, which is hereby incorporated herein by reference in its entirety.

Another aspect of the invention is a method for installing a photovoltaic roofing system comprising disposing on a roof and electrically interconnecting a plurality of photovoltaic roofing elements as described herein. The disposal on the roof and electrical interconnections can be performed in any desirable order. In certain embodiments, the photovoltaic roofing elements themselves can be assembled on the roof, for example in conjunction with electrically interconnecting them, as described above with reference U.S. Provisional Patent Application Ser. No. 61/043,707 filed Apr. 9, 2008, U.S. Provisional Patent Application Ser. No. 61/014,902 filed Dec. 19, 2007 and U.S. Patent Application Publication no. 2009/0159118, the entirety of each of which is incorporated herein by reference.

Another aspect of the invention is a roof comprising a roof deck and a photovoltaic roofing system as described herein disposed on the roof deck. The photovoltaic roofing elements described herein can be utilized with many different building structures, including residential, commercial and industrial building structures.

Another aspect of the invention is a kit for the installation of a photovoltaic roofing system, the kit comprising a plurality of photovoltaic roofing elements as described herein.

Further, the foregoing description of embodiments of the present invention has been presented for the purposes of illustration and description. It is not intended to be exhaustive or to limit the invention to the precise forms disclosed. As the person of skill in the art will recognize, many modifications and variations are possible in light of the above teaching. It will be apparent to those skilled in the art that various modifications and variations can be made to the present invention without departing from the scope of the invention. Thus, it is intended that the present invention cover the modifications and variations of this invention provided they come within the scope of the claims and their equivalents.

What is claimed is:

1. A photovoltaic roofing system comprising an electrically-interconnected plurality of photovoltaic roofing elements, each photovoltaic roofing element comprising:
   a flexible multilayer asphalt shingle comprising a plurality of asphalt layers;

a photovoltaic element disposed on the flexible multilayer asphalt shingle; and an electrical connector operatively coupled to the photovoltaic element, wherein the flexible multilayer asphalt shingle has formed therein a recess shaped to receive the electrical connector, the recess being formed as a hole or a cutout through the entire thickness of at least one, but not all of the asphalt layers of the flexible multilayer asphalt shingle, such that the recess does not go all the way through the flexible multilayer asphalt shingle, the plurality of photovoltaic roofing elements comprising
- a first photovoltaic roofing element, the electrical connector of the first photovoltaic roofing element being disposed entirely within the recess; and
- a second photovoltaic roofing element disposed so as to cover the electrical connector of the first photovoltaic roofing element.

2. The photovoltaic roofing system of claim 1, wherein in each photovoltaic roofing element, the recess is formed in a top surface of the flexible multilayer asphalt shingle.

3. The photovoltaic roofing system of claim 1, wherein in each photovoltaic roofing element, the recess is formed in a side of the flexible multilayer asphalt shingle.

4. The photovoltaic roofing system of claim 1, wherein in each photovoltaic roofing element, the recess is adapted to at least partially receive wires that partially connect the photovoltaic element to mating electrical connectors.

5. A roof comprising a roof deck and a photovoltaic roofing system according to claim 1 disposed on the roof deck.

6. A method for installing the photovoltaic roofing system of claim 1, the method comprising disposing on a roof and electrically interconnecting the plurality of photovoltaic roofing elements.

7. The photovoltaic roofing system according to claim 1, wherein in each photovoltaic roofing element, the electrical connector is selected from a mating electrical connector and a junction box.

8. The photovoltaic system according to claim 1, wherein the electrical connector of the first photovoltaic roofing element is affixedly disposed in the recess.

9. The photovoltaic system according to claim 1, wherein the electrical connector of the first photovoltaic roofing element is movable with respect to the recess.

10. The photovoltaic system according to claim 1, wherein in each photovoltaic roofing element, the electrical connector is selected from a mating electrical connector and a junction box, and wherein the electrical connector of the first photovoltaic roofing element is affixedly disposed in the recess.

11. The photovoltaic system according to claim 1, wherein in each photovoltaic roofing element, the electrical connector is selected from a mating electrical connector and a junction box, and wherein the electrical connector of the first photovoltaic roofing element is movable with respect to the recess.

12. The photovoltaic roofing system of claim 1, wherein in each photovoltaic roofing element, the recess is formed in a top surface of the flexible multilayer asphalt shingle, and wherein in each photovoltaic roofing element, the electrical connector is selected from a mating electrical connector and a junction box.

13. The photovoltaic roofing system of claim 1, wherein in each photovoltaic roofing element, the recess is formed in a side of the flexible multilayer asphalt shingle, and wherein in each photovoltaic roofing element, the electrical connector is selected from a mating electrical connector and a junction box.

14. The photovoltaic roofing system of claim 1, wherein in each photovoltaic roofing element, the recess is formed as a continuous notch running the length of the shingle.

15. The photovoltaic roofing system of claim 1, wherein in each photovoltaic roofing element, the recess is formed as a continuous notch running the length of the shingle, and wherein in each photovoltaic roofing element, the electrical connector is selected from a mating electrical connector and a junction box.

* * * * *